(12) United States Patent
Lee et al.

(10) Patent No.: US 11,882,261 B2
(45) Date of Patent: Jan. 23, 2024

(54) CAMERA DEVICE, DUAL CAMERA DEVICE AND TRIPLE CAMERA DEVICE

(71) Applicant: LG INNOTEK CO., LTD., Seoul (KR)

(72) Inventors: Sung Guk Lee, Seoul (KR); Kyoung Ho Yoo, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 0 days.

(21) Appl. No.: 17/804,613

(22) Filed: May 31, 2022

(65) Prior Publication Data

US 2022/0295039 A1     Sep. 15, 2022

Related U.S. Application Data

(63) Continuation of application No. 17/042,725, filed as application No. PCT/KR2019/004520 on Apr. 15, 2019, now Pat. No. 11,381,803.

(30) Foreign Application Priority Data

Apr. 13, 2018  (KR) .......................... 10-2018-0043324
Apr. 13, 2018  (KR) .......................... 10-2018-0043326

(51) Int. Cl.
*H04N 13/243*    (2018.01)
*G01R 33/07*     (2006.01)
(Continued)

(52) U.S. Cl.
CPC ......... *H04N 13/243* (2018.05); *G01R 33/072* (2013.01); *G03B 17/02* (2013.01);
(Continued)

(58) Field of Classification Search
None
See application file for complete search history.

(56) References Cited

U.S. PATENT DOCUMENTS 11,381,803 B2 *   7/2022  Lee .......................... G03B 3/10
2015/0316745 A1  11/2015  Chen et al.
(Continued)

FOREIGN PATENT DOCUMENTS

CN    101076082 A    11/2007
CN    102573277 A     7/2012
(Continued)

OTHER PUBLICATIONS

Office Action dated Jul. 17, 2022 in Korean Application No. 10-2018-0043324.
(Continued)

*Primary Examiner* — James M Hannett
(74) *Attorney, Agent, or Firm* — Saliwanchik, Lloyd & Eisenschenk

(57) ABSTRACT

The present embodiment relates to a camera device comprising a first camera device, a second camera device, and a third camera device disposed between the first camera device and the second camera device, wherein: the first camera device includes a first bobbin, a first coil disposed on the first bobbin, a first magnet facing the first coil, and a second coil disposed under the first magnet; the second camera device includes a second bobbin, a third coil disposed on the second bobbin, and a second magnet facing the third coil; the third camera device includes a third bobbin, a fourth coil disposed on the third bobbin, a third magnet facing the fourth coil, a fourth magnet disposed on the third bobbin, and a Hall sensor for sensing the fourth magnet; and the Hall sensor of the third camera device is disposed between the fourth magnet of the third camera device and the second camera device.

20 Claims, 17 Drawing Sheets

(51) Int. Cl.
    *G03B 17/02*     (2021.01)
    *G03B 17/56*     (2021.01)
    *H04N 23/45*     (2023.01)
    *H04N 23/51*     (2023.01)

(52) U.S. Cl.
    CPC ............ *G03B 17/56* (2013.01); *H04N 23/45* (2023.01); *H04N 23/51* (2023.01); *H04N 2213/001* (2013.01)

(56) References Cited

U.S. PATENT DOCUMENTS

| | | | |
|---|---|---|---|
| 2016/0018720 A1 | 1/2016 | Bachar et al. | |
| 2016/0381260 A1 | 12/2016 | Narayanswamy | |
| 2018/0003920 A1 | 1/2018 | Hu et al. | |
| 2021/0075897 A1* | 3/2021 | Li | ........................ H04N 23/55 |

FOREIGN PATENT DOCUMENTS

| | | |
|---|---|---|
| CN | 203933331 U | 11/2014 |
| CN | 206547145 U | 10/2017 |
| JP | 2011-109908 A | 6/2011 |
| JP | 2017-62470 A | 3/2017 |
| KR | 10-1470470 B1 | 12/2014 |
| KR | 10-2015-0033100 A | 4/2015 |
| KR | 10-2016-0005927 A | 1/2016 |
| KR | 10-2018-0009098 A | 1/2018 |
| KR | 10-2018-0013286 A | 2/2018 |
| WO | 2016/209373 A1 | 12/2016 |

OTHER PUBLICATIONS

Office Action dated Jul. 17, 2022 in Korean Application No. 10-2018-0043326.
Office Action dated Oct. 28, 2022 in Chinese Application No. 201980025395.1.
Office Action dated Nov. 14, 2022 in Korean Application No. 10-2018-0043326.
International Search Report dated Jul. 25, 2019 in International Application No. PCT/KR2019/004520.
Office Action dated Oct. 8, 2021 in Chinese Application No. 201980025395.1.
Supplementary European Search Report dated Jan. 25, 2022 in European Application No. 19784742.9.
Office Action dated Apr. 20, 2022 in Chinese Application No. 201980025395.1.
Office Action dated Oct. 12, 2021 in U.S. Appl. No. 17/042,725.
Notice of Allowance dated Feb. 22, 2022 in U.S. Appl. No. 17/042,725.

* cited by examiner

CAMERA DEVICE, DUAL CAMERA DEVICE AND TRIPLE CAMERA DEVICE

CROSS-REFERENCE TO RELATED APPLICATIONS

This application is a continuation of U.S. application Ser. No. 17/042,725, filed Sep. 28, 2020; which is the U.S. national stage application of International Patent Application No. PCT/KR2019/004520, filed Apr. 15, 2019, which claims the benefit under 35 U.S.C. § 119 of Korean Patent Application Nos. 10-2018-0043324, filed Apr. 13, 2018, and 10-2018-0043326, filed Apr. 13, 2018, the disclosures of each of which are incorporated herein by reference in their entirety.

TECHNICAL FIELD

The present embodiment relates to a camera device, a dual camera device and a triple camera device.

BACKGROUND ART

The content described below provides background information for the present embodiment, but does not describe the prior art.

As the spread of various mobile terminals is widely generalized and wireless Internet services are commercialized, the demands of consumers related to the mobile terminals are also diversified, and various types of additional devices are mounted on the mobile terminals.

A representative one is a camera device that photographs a subject as a photo or video. Meanwhile, a dual camera device has been researched recently, because each camera in the dual camera device can photograph different portion, and the two photographed images can be combined into a single image, it is possible to photograph images that cannot be photographed with the existing single camera device.

However, there is a need for a camera device that can obtain an image that cannot be photographed even by a dual camera device.

DETAILED DESCRIPTION OF THE INVENTION

Technical Subject

The present embodiment is intended to provide a triple camera device capable of obtaining an image that cannot be photographed by a dual camera device.

In addition, it is intended to provide a magnet arrangement that minimizes magnetic field interference in a triple camera device.

Further, it is intended to provide a magnet arrangement that minimizes magnetic field interference between two or more camera devices.

Technical Solution

A camera device according to the present embodiment comprises a first camera device, a second camera device, and a third camera device disposed between the first camera device and the second camera device, wherein the first camera device comprises a first bobbin, a first coil disposed on the first bobbin, a first magnet facing the first coil, and a second coil disposed under the first magnet, wherein the second camera device comprises a second bobbin, a third coil disposed on the second bobbin, and a second magnet facing the third coil, wherein the third camera device comprises a third bobbin, a fourth coil disposed on the third bobbin, a third magnet facing the fourth coil, a fourth magnet disposed on the third bobbin, and a Hall sensor for sensing the fourth magnet, and wherein the Hall sensor of the third camera device may be disposed between the fourth magnet of the third camera device and the second camera device.

The first camera device further comprises a first cover, a first housing disposed in the first cover, and a first base disposed under the first housing, wherein the first bobbin is disposed in the first housing, the first magnet is disposed on the first housing; the second coil is disposed on the first base and faces the first magnet, wherein the second camera device further comprises a second cover, the second bobbin is disposed in the second cover, and the second magnet is disposed between the third coil and the second cover, wherein the third camera device further comprises a third cover; the third bobbin is disposed in the third cover, and the third magnet is disposed between the fourth coil and the third cover, wherein the third cover comprises a third upper plate comprising a hole, a plurality of third lateral plates extending downward from the third upper plate, and the plurality of third lateral plates comprises a third-first lateral plate facing the second cover, and wherein the Hall sensor may be disposed between the fourth magnet and the third-first lateral plate.

The second cover comprises a second upper plate comprising a hole, and a plurality of second lateral plates extending downward from the second upper plate, wherein the plurality of second lateral plates comprises a second-first lateral plate facing the third-first lateral plate, a second-second lateral plate disposed on the opposite side of the second-first lateral plate, and a second-third lateral plate and a second-fourth lateral plate disposed on the opposite sides between the second-first and second-second lateral plates, wherein the Hall sensor is disposed closer to the lateral plate second-fourth than the second-third lateral plate, wherein the second magnet comprises a second-first magnet disposed between the second coil and the second-third lateral plate, and a second-second magnet disposed between the second coil and the second-fourth magnet, wherein the second-first magnet is disposed closer to the second-first lateral plate than the second-second lateral plate, the second-second magnet may be disposed closer to the second-second lateral plate, and the second-second magnet may be disposed closer to the second-second lateral plate than the second-first lateral plate.

Each of the second-first magnet and the second-second magnet may be a flat magnet comprising a flat plate shape.

Each of the second-first magnet and the second-second magnet is a corner magnet comprising a plurality of lateral surfaces, and the plurality of lateral surfaces of the corner magnet may comprise two lateral surfaces facing the plurality of second lateral plates and a lateral surface connecting the two lateral surfaces in an inclined manner and facing the second coil.

The plurality of third lateral plates of the third cover comprise the third-first lateral plate, the third-second lateral plate disposed opposite side of the third-first lateral plate, a third-third lateral plate and a third-fourth lateral plate disposed opposite to each other between the third-first lateral plate and the third-second lateral plate, wherein the fourth magnet is disposed closer to the third-fourth lateral plate than the third-third lateral plate, wherein the third magnet comprises a third-first-first magnet disposed between the fourth coil and the third-third lateral plate and a third-first-second magnet disposed between the fourth coil and the third-fourth lateral plate, wherein the third bobbin comprises a first lateral surface facing the third-first-first magnet and a second lateral surface facing the third-first-second magnet, wherein the fourth coil comprises a fourth-first coil disposed on a first lateral surface of the third bobbin, and a fourth-second coil disposed on the second lateral surface of the third bobbin, wherein each of the fourth-first coil and the fourth-second coil is disposed so that currents in the upper and the lower portions flow in a direction different from each other with reference to each of the centers thereof, and wherein the upper and lower portions of each of the third-first-first magnet and the third-first-second magnet may have different polarities.

The first camera device further comprises a Hall sensor for sensing the first magnet, wherein the first cover comprises a first upper plate comprising a hole, and a plurality of first lateral plates extending downward from the first upper plate, wherein the plurality of first lateral plates comprises a first-first lateral plate facing the third cover, a first-second lateral plate disposed opposite the first-first lateral plate, and a first-third lateral plate and a first-fourth lateral plate disposed opposite to each other between the first-first lateral plate and the first-second lateral plate, a first-first corner between the first-second lateral plate and the first-third lateral plate, and a first-second corner between the first-second lateral plate and the first-fourth lateral plate, and wherein the Hall sensor of the first camera device may comprise a first-first Hall sensor disposed between the first-first corner and a central axis in the vertical direction of the first cover, and a first-second Hall sensor disposed between the first-second corner and the central axis of the first cover.

Each of the first bobbin, the second bobbin, and the third bobbin comprises a hole, and an inner diameter of the third bobbin may be larger than an inner diameter of the first bobbin and an inner diameter of the second bobbin.

A virtual first straight line may pass through the optical axis of the first camera device, the optical axis of the second camera device, and the optical axis of the third camera device.

The first magnet, the second magnet, the third magnet, and the fourth magnet may not be disposed on the virtual first straight line.

The size of the third bobbin may be larger than the size of the first bobbin and the size of the second bobbin.

The size of the third coil may be larger than the size of the first coil and the size of the third coil.

The second magnet may comprise a second-first magnet and a second-second magnet spaced apart from each other, and the second-first magnet may be disposed closer to the third camera device than the second-second magnet.

In the second camera device, a magnet may not be disposed between the third camera device and the second bobbin.

The first magnet may be disposed at a corner of the first housing.

The plurality of third lateral plates of the third cover comprises the third-first lateral plate, the third-second lateral plate disposed opposite the third-first lateral plate, and a lateral plate third-third and a lateral plate third-fourth disposed opposite to each other between the third-first lateral plate and the third-second lateral plate; the third magnet comprises a third-first magnet disposed between the fourth coil and the third-third lateral plate, and a third-second magnet disposed between the fourth coil and the third-fourth lateral plate; and the fourth magnet may be disposed closer to the third-second magnet than the third-first magnet.

The third camera device further comprises: a fifth magnet disposed between the first camera device and the third bobbin; and the fifth magnet may be disposed closer to the third-first magnet than the third-second magnet.

The triple camera device according to the present embodiment comprises: a camera device; a first lens coupled to the first bobbin of the first camera device of the camera device; a first image sensor disposed under the first lens; a second lens coupled to the second bobbin of the second camera device of the camera device; a second image sensor disposed under the second lens; a third lens coupled to the third bobbin of the third camera device of the camera device; and a third image sensor disposed under the third lens.

A camera device according to the present embodiment comprises a first camera device and a third camera device, wherein, the first camera device comprises a first cover, a first housing disposed in the first cover, a first bobbin disposed in the first housing, a first-first coil disposed on the first bobbin, a first magnet disposed in the first housing and facing the first-first coil, a first base disposed under the first housing, and a first-second coil first magnet disposed on the first base and facing the first magnet, wherein the third camera device comprises a third cover, a third bobbin disposed in the third cover, a third coil disposed on the third bobbin, a third-first magnet disposed between the third coil and the third cover and facing the third coil, a third-second magnet disposed on the third bobbin, and a third Hall sensor sensing the third-second magnet, wherein the third cover comprises a third upper plate comprising a hole, and a plurality of third lateral plates extending downward from the third upper plate, wherein the plurality of third lateral plates comprise a third-second lateral plate facing the first cover and a third-first lateral plate disposed at the opposite side of the third-second lateral plate, and wherein the third Hall sensor may be disposed between the third-second magnet and the third-first lateral plate.

A camera device according to the present embodiment comprises a second camera device and a third camera device, wherein the second camera device comprises a second cover, a second bobbin disposed in the second cover, a second coil disposed on the second bobbin, a second magnet disposed between the second coil and the second cover and facing the second coil, wherein the third camera device comprises a third cover, a third bobbin disposed in the third cover, a third coil disposed on the third bobbin, a third-first magnet disposed between the third coil and the third cover and facing the third coil, a third-second magnet disposed on the third bobbin, and a third Hall sensor sensing the third-second magnet, wherein the third cover comprises a third upper plate comprising a hole, and a plurality of third lateral plates extending downward from the third upper plate, wherein the plurality of third lateral plates comprises a third-first lateral plate opposing the second cover, the third hall sensor is disposed between the third-second magnet and the third-first lateral plate, the second cover comprises a second upper plate comprising a hole, and a plurality of second lateral plates extending downward from the second upper plate, wherein the plurality of second lateral plates comprises a second-first lateral plate facing the third-first lateral plate, a second-second lateral plate disposed at the opposite side of the second-first lateral plate, and a second-fourth lateral plate and a second-third lateral plate disposed opposite to each other between the second-first and second-second lateral plates, wherein the third Hall sensor is disposed closer to the second-fourth lateral plate than the second-third lateral plate, wherein the second magnet comprises a second-first magnet disposed between the second coil and the second-third lateral plate, and a second-second magnet disposed between the second coil and the second-fourth lateral plate, wherein the second-first magnet is disposed closer to the second-first lateral plate than the second-second lateral plate, and wherein the second-second magnet may be disposed closer to the second-second lateral plate than the second-first lateral plate.

A lens driving apparatus according to the present embodiment comprises: a cover comprising an upper plate comprising a hole and a lateral plate extending from the upper plate; a bobbin disposed in the cover; a coil disposed on the bobbin; a first magnet disposed between the coil and the lateral plate of the cover and facing the coil; a second magnet disposed on the bobbin; a substrate disposed between the bobbin and the lateral plate of the cover; and a Hall sensor disposed on the substrate and facing the second magnet, wherein the coil comprises first to eighth portions disposed in an octagonal shape, the first portion connecting the second portion and the eighth portion, the third portion connects the second portion and the fourth portion, the length of the first portion is longer than the length of the third portion, and the second magnet may be disposed outside the first portion of the coil.

The lateral plate of the cover comprises a first lateral plate, a second lateral plate disposed on the opposite side of the first lateral plate, and a 3rd lateral plate and a 4th lateral plate disposed opposite to each other between the first lateral plate and the second lateral plate, wherein the bobbin comprises a hole penetrating the bobbin in the optical axis direction, a first lateral surface facing the first lateral plate, a second lateral surface facing the second lateral plate, and a third lateral surface facing the third lateral plate, a fourth lateral surface facing the fourth lateral plate, and a first groove formed between the second magnet and the hole of the bobbin and in which a portion of the coil is disposed, and wherein the first groove may be formed to have an inclination with the first side and the fourth side.

The first magnet comprises a first-first magnet disposed between the third lateral plate of the cover and the third lateral surface of the bobbin, and a first-second magnet disposed between the fourth lateral plate of the cover and the fourth lateral surface of the bobbin, wherein the first magnet may not be disposed between the first lateral plate of the cover and the first lateral surface of the bobbin, and between the second lateral plate of the cover and the second lateral surface of the bobbin.

The bobbin may further comprise a second groove formed between the first groove and the first lateral plate of the cover, wherein the second magnet may be disposed in the second groove.

The first groove comprises a first surface facing the inner surface of the coil, a second surface facing the lower surface of the coil, and a third surface facing the outer surface of the coil, wherein the first surface of the first groove may form an angle of 135 degrees with the first lateral surface of the bobbin.

The lens driving device further comprises a third magnet disposed on the bobbin, wherein the third magnet is symmetrical with respect to the second magnet and the optical axis, and wherein the bobbin may further comprise a third groove symmetrical with respect to the first groove and the optical axis and in which a portion of the coil is disposed, and a fourth groove formed between the third groove and the second lateral plate of the cover and in which the third magnet is disposed.

The lens driving device further comprises a housing disposed between the cover and the bobbin and in which the first magnet is disposed, and a first elastic member connecting an upper portion of the bobbin and an upper portion of the housing, wherein the first elastic member comprises an inner side portion coupled to an upper portion of the bobbin, an outer side portion coupled to an upper portion of the housing, and a connecting portion connecting the inner side portion and the outer side portion, wherein the bobbin comprises a step portion formed by recessing a portion of the upper surface of the bobbin and overlapped with the connecting portion in the optical axis direction, wherein the stepped portion comprises a first stepped portion formed between the first lateral surface and the fourth lateral surface, and a second stepped portion formed between the second lateral surface and the fourth lateral surface, and wherein the shape of the first stepped portion may be different from the shape of the second stepped portion.

The lens driving device further comprises a second elastic member coupled to a lower portion of the bobbin, wherein the second elastic member comprises two elastic units spaced apart from each other, the bobbin further comprises a support portion protruding from a plurality of lateral surfaces and disposed at a lower end of the coil, a fifth groove formed in the support portion, and a sixth groove formed in the support portion opposite to the fifth groove, the coil comprises two lead wires, and the two lead wires of the coil may be connected to the two elastic units through the fifth groove and the sixth groove, respectively.

The lens driving device further comprises a housing disposed between the cover and the bobbin and in which the first magnet is disposed, wherein at least a portion of the Hall sensor is protruded from the inner surface of the housing, the bobbin comprises a fifth lateral surface disposed more toward the inner side than the support portion formed on the first lateral surface and facing the Hall sensor, and the second groove may be formed on the fifth lateral surface.

The substrate comprises a first portion disposed on the first lateral plate of the cover, a second portion disposed on the third lateral plate of the cover, and a third portion connecting the first portion and the second portion, wherein a plurality of terminals electrically connected to the coil and the Hall sensor is disposed at the lower end of the first portion, the Hall sensor is disposed on the inner surface of the second portion, and a capacitor may be disposed on the inner surface of the third portion.

The triple camera device according to the present embodiment comprises a first camera device, a second camera device, and a third camera disposed between the first camera device and the second camera device and comprising the lens driving device according to claim 1, wherein the first camera device comprises a bobbin, a first coil disposed on the bobbin of the first camera device, a magnet facing the first coil of the first camera device, and a second coil disposed under the magnet of the first camera device, wherein the second camera device comprises a bobbin, a coil disposed on the bobbin of the second camera device, and a magnet facing the coil of the second camera device, and wherein the Hall sensor of the third camera device may be disposed between the second magnet of the third camera device and the second camera device.

Advantageous Effects

Through the present embodiment, an image that cannot be photographed can be obtained by a dual camera device.

Further, the magnetic field interference between camera devices can be minimized in a dual camera device or a triple camera device.

BEST MODE

Figure 1:
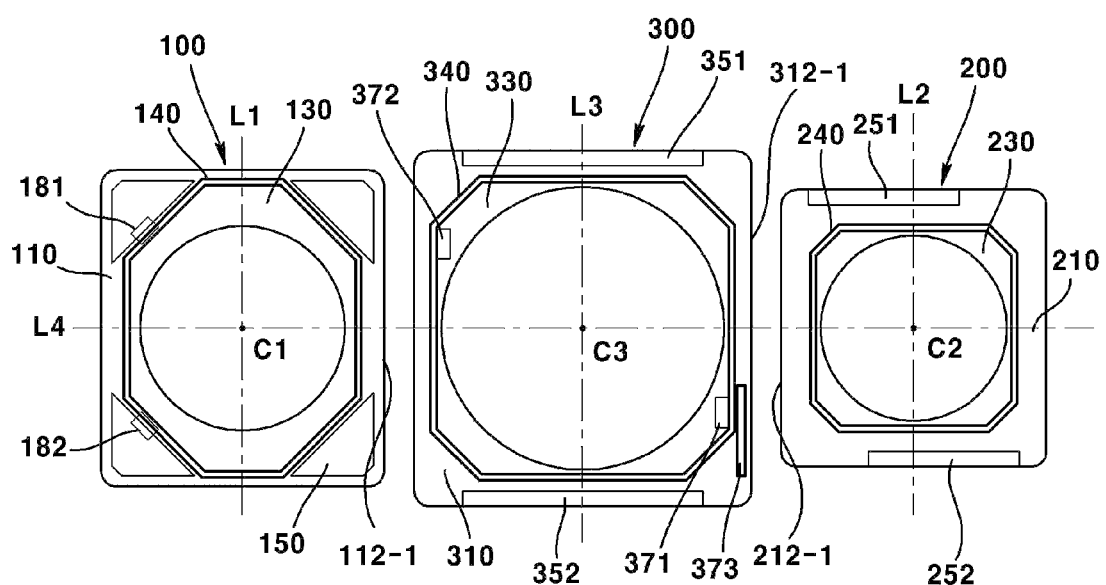
FIG. 1 is a see-through view from above of a triple camera device according to the present embodiment.

Hereinafter, some embodiments of the present invention will be described with reference to exemplary drawings for the convenience of description. However, the technical spirit of the present invention is not limited to some exemplary embodiments.

In addition, in describing the components of the embodiment of the present invention, terms such as first, second, A, B, (a), and (b) may be used. These terms are merely intended to distinguish the components from other components, and the terms do not limit the nature, order or sequence of the components. Accordingly, the descriptions of the first, second, third, first-first, first-second, and first-third and the like can be changed from the description in the "Preferred Embodiments" and the contents in the "claims". For example, the first bobbin described in "Preferred Embodiments" can be used as the second bobbin or bobbin in the "claims". This can be applied equally to all components.

When a component is described as being "connected" or "coupled" to another component, the component may be directly connected or coupled to the other component, however, it should be understood that another element may be "connected" or "coupled" between components.

'Optical axis direction' used below is defined as the optical axis direction of the lens of the camera apparatus. At this time, the optical axis of the lens may correspond to the optical axis of the image sensor. Meanwhile, the 'optical axis direction' may correspond to the 'up and down' direction and the 'z axis direction.

The "auto focus function" used below is defined as the function that automatically focuses on a subject by moving the lens in the direction of the optical axis according to the distance of the subject so that clear images of the subject can be obtained on the image sensor. Meanwhile, 'auto focus' can be used interchangeably with 'Auto Focus (AF)'.

The "image stabilization function" used below is defined as a function of moving or tilting a lens module in a direction perpendicular to the optical axis direction so as to cancel a vibration (movement) generated in an image sensor by an external force. Meanwhile, "image stabilization" may be used interchangeably with "Optical Image Stabilization (OIS)".

Hereinafter, "triple camera device" and "camera device" may be interchangeably used. That is, the camera device may be described as comprising three camera devices. In addition, "dual camera device" and "camera device" may be interchangeably used. That is, the camera device may be described as comprising two camera devices.

Hereinafter, a configuration of the optical device according to the present embodiment will be described.

An optical device may be any one among a cell phone, a mobile phone, a smart phone, a portable smart device, a digital camera, a laptop computer, a digital broadcasting terminal, a personal digital assistant (PDA), a portable multimedia player (PMP), and navigation. However, the type of the optical device is not limited thereto, and any device for photographing an image or picture may be comprised in the optical device.

The optical device may comprise a main body. The main body may form the appearance of the optical device. The main body can accommodate a camera device. A display unit may be disposed on one surface of the main body. For example, a display unit and a camera device may be disposed on one surface of the main body, and another camera device may be additionally disposed on the other surface of the main body (a surface located on the opposite side of the one surface).

The optical device may comprise a display unit. The display unit may be disposed on one surface of the main body. The display unit may output an image captured by the camera device.

The optical device may comprise a camera device. The camera device may be disposed in the main body. At least a portion of the camera device may be accommodated inside the main body. A plurality of camera devices may be provided. The camera devices may be disposed on one side of the main body and the other side of the main body, respectively. The camera device may take an image of a subject.

Hereinafter, a configuration of a camera device according to the present embodiment and a modified embodiment will be described with reference to the drawings.

Figure 2:
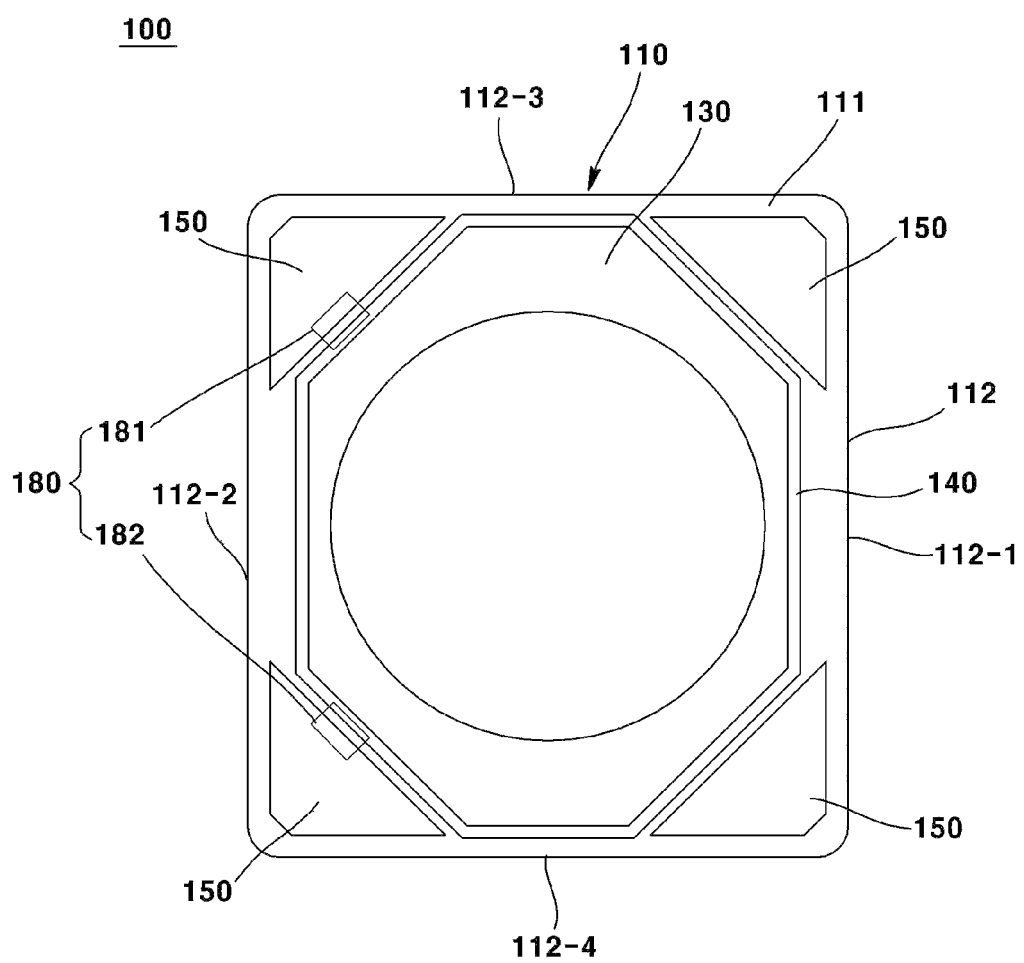
FIG. 2 is a see-through view illustrating a first camera device of FIG. 1.
Figure 3:
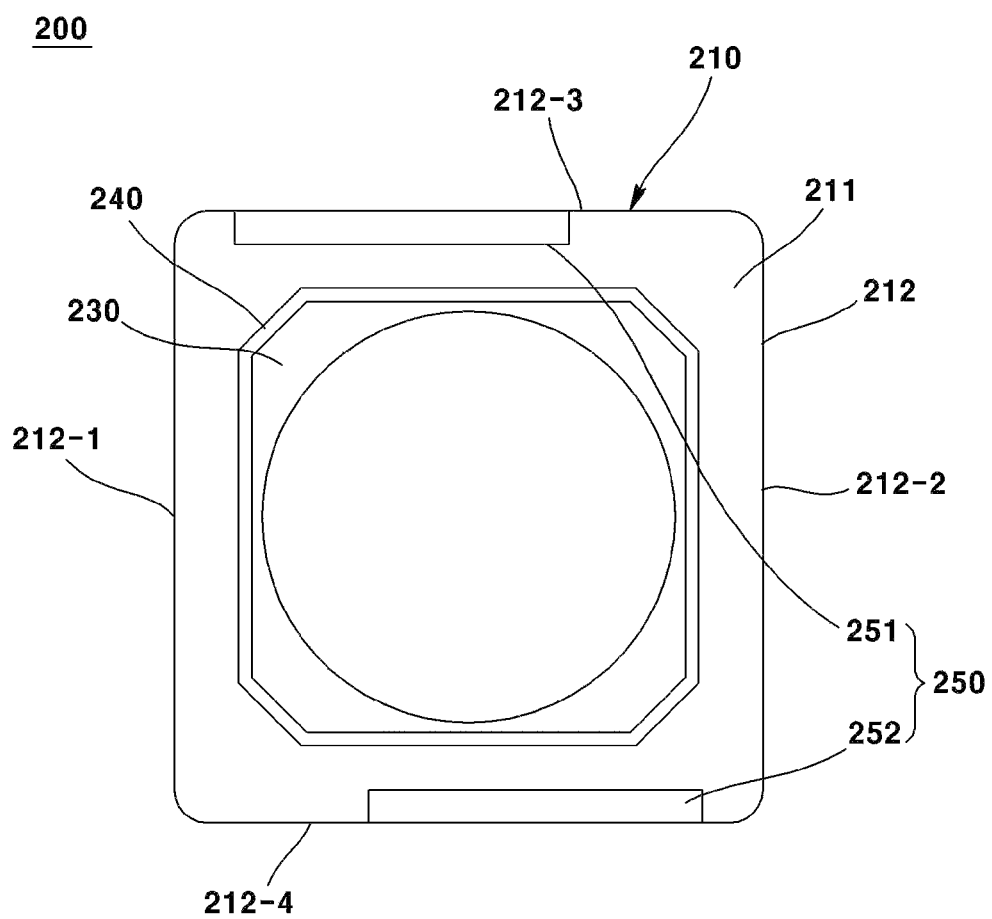
FIG. 3 is a see-through view illustrating a second camera device of FIG. 1.
Figure 4:
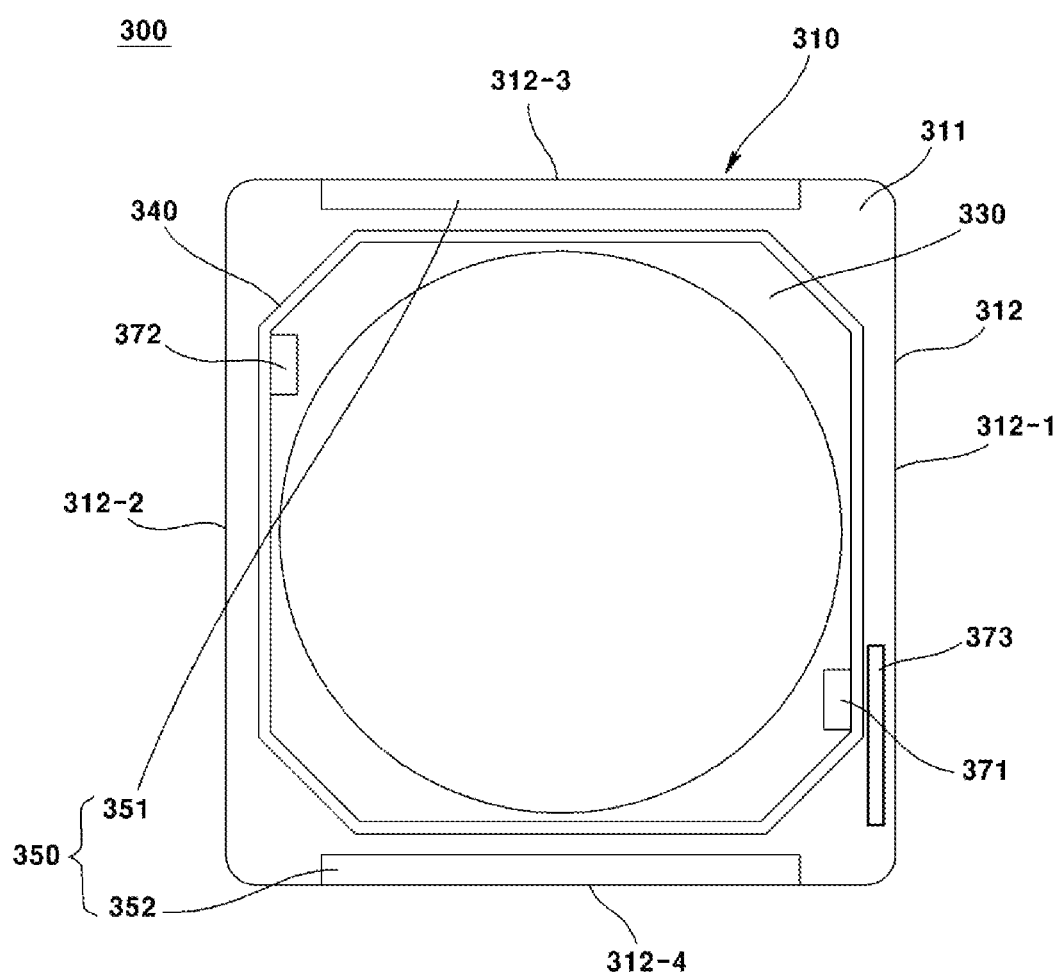
FIG. 4 is a see-through view illustrating a third camera device of FIG. 1.
Figure 5:
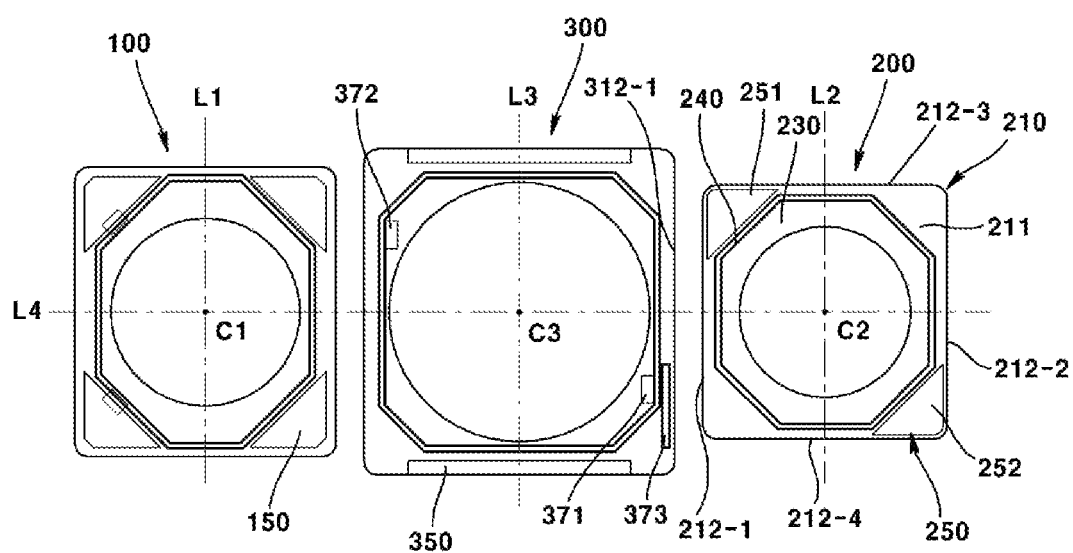
FIG. 5 is a see-through view from above of a triple camera device according to a modified embodiment.
Figure 6:
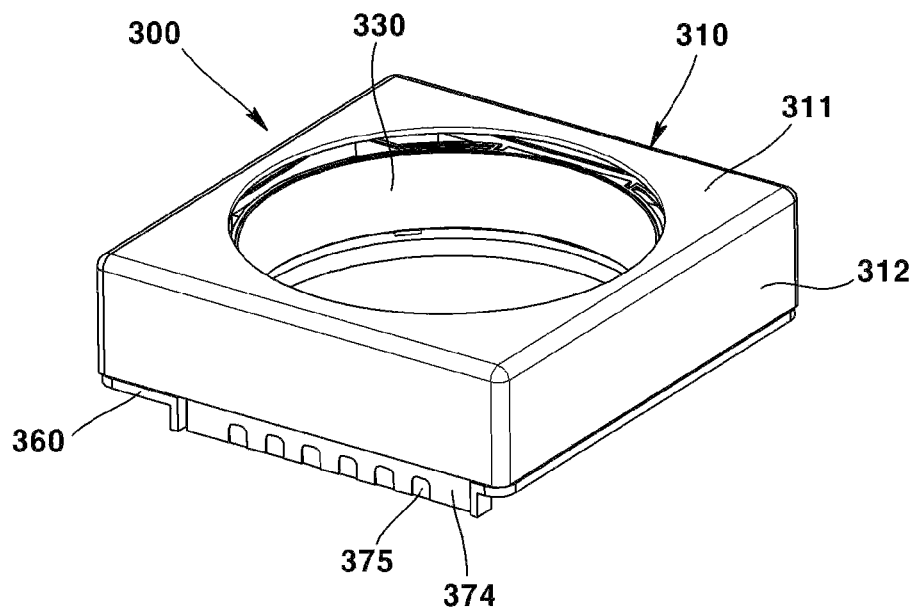
FIG. 6 is a perspective view of a third camera device according to the present embodiment.
Figure 7:
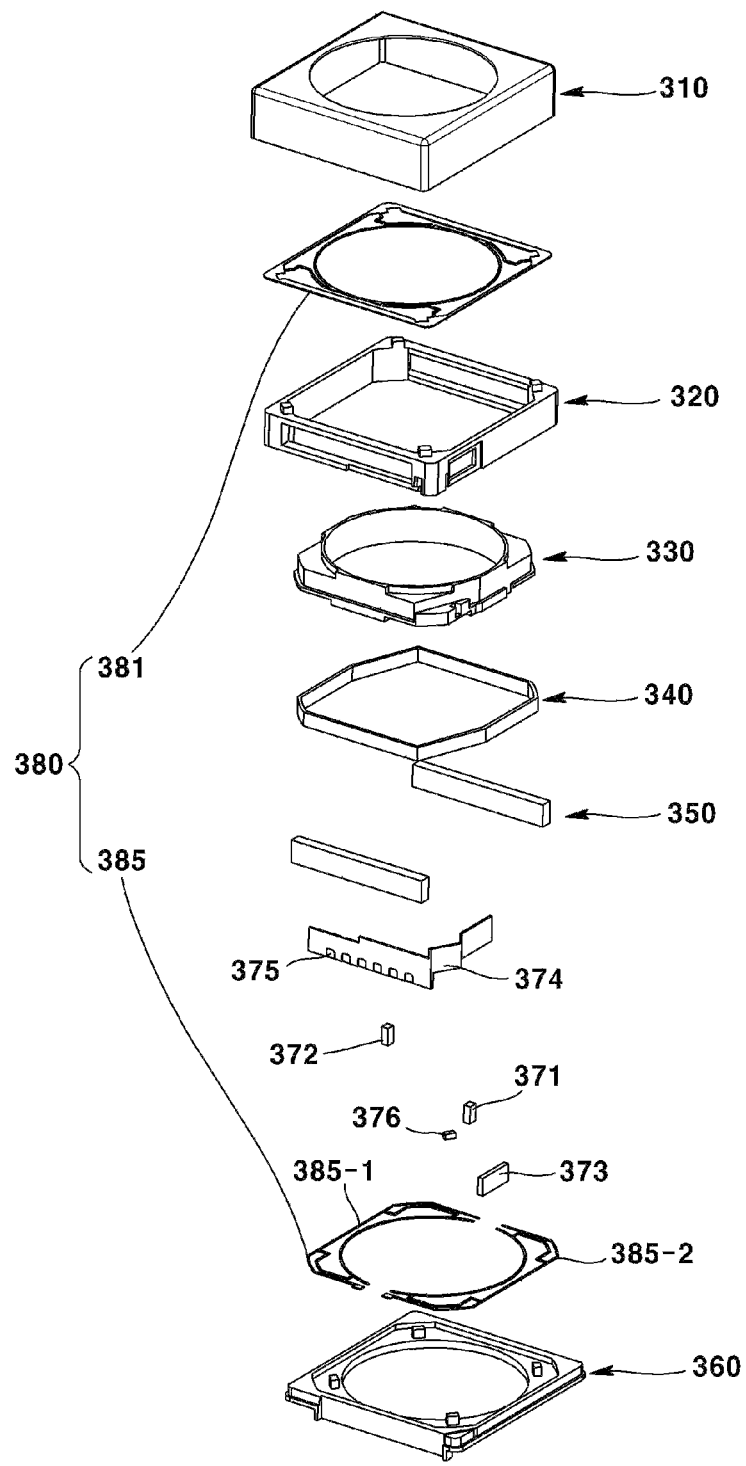
FIG. 7 is an exploded perspective view of a third camera device according to the present embodiment.
Figure 8:
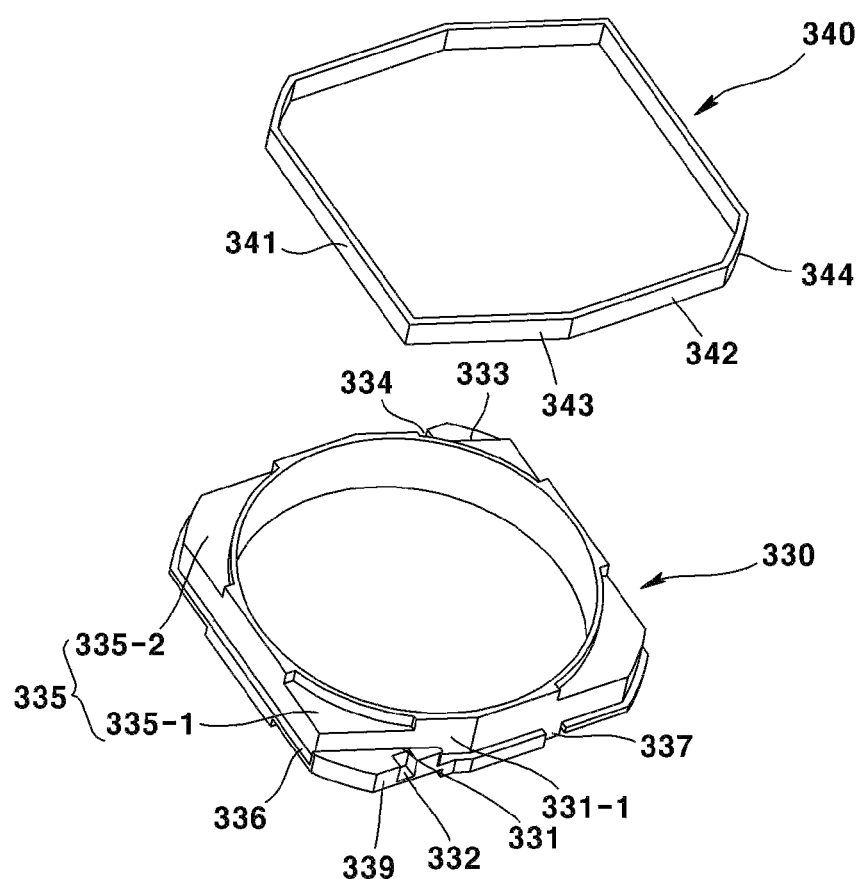
FIG. 8 is an exploded perspective view illustrating a third coil and a third bobbin of FIG.
Figure 9:
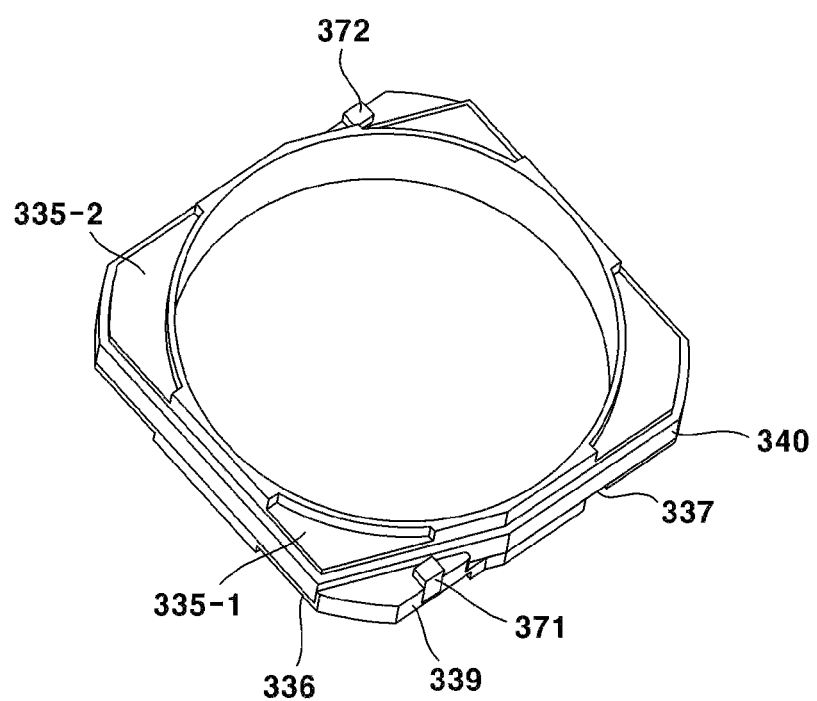
FIG. 9 is a perspective view illustrating a state in which a third coil and a third bobbin, and a third-second magnet and a third-third magnet of FIG. 8 are coupled.
Figure 10:
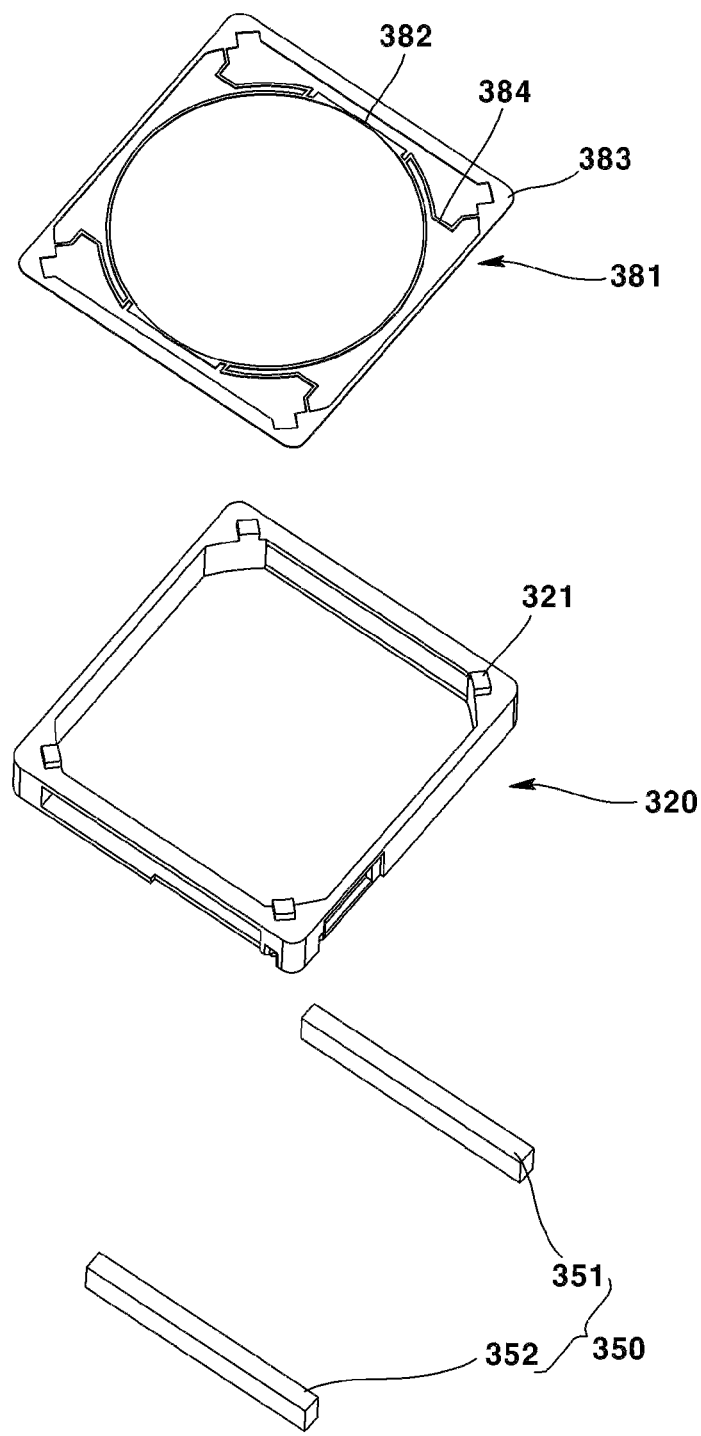
FIG. 10 is an exploded perspective view illustrating a first elastic member, a third housing, and a third-first magnet of FIG. 7.
Figure 11:
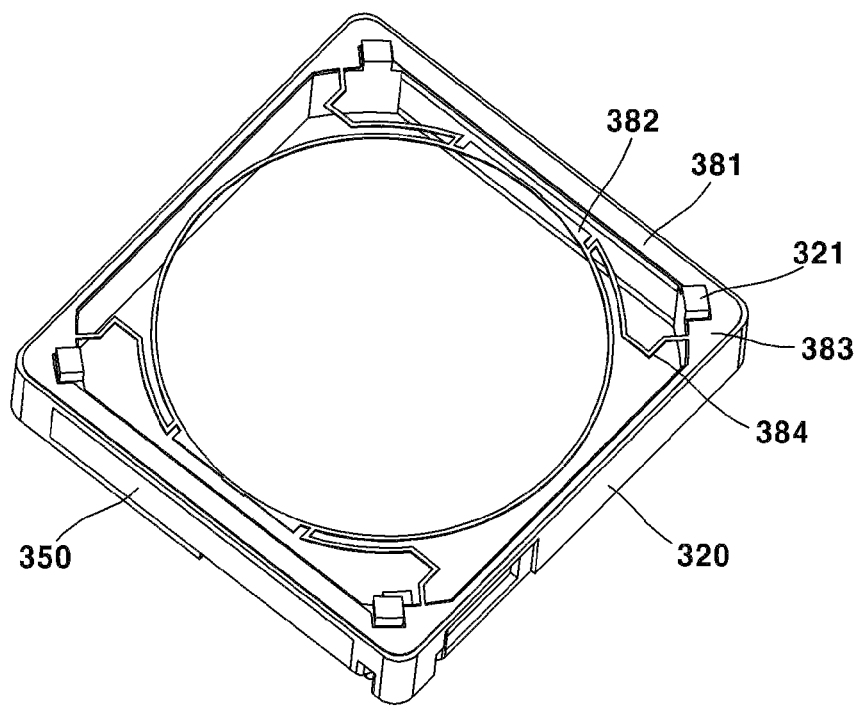
FIG. 11 is a perspective view illustrating a state in which the components of FIG. 10 are coupled.
Figure 12:
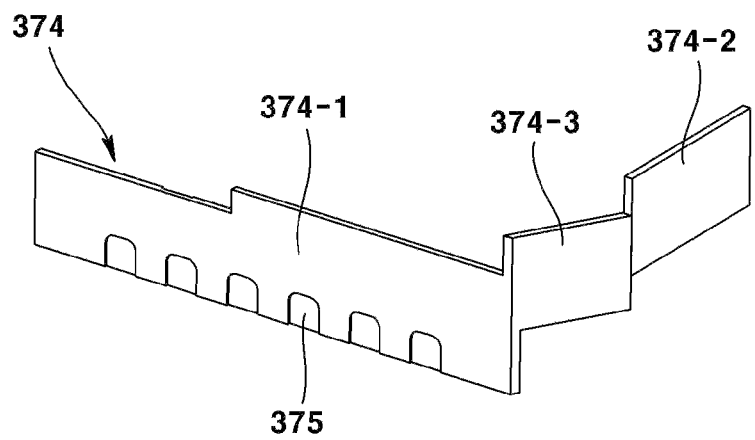
FIG. 12 is a perspective view illustrating a third substrate of FIG. 7.
Figure 13:
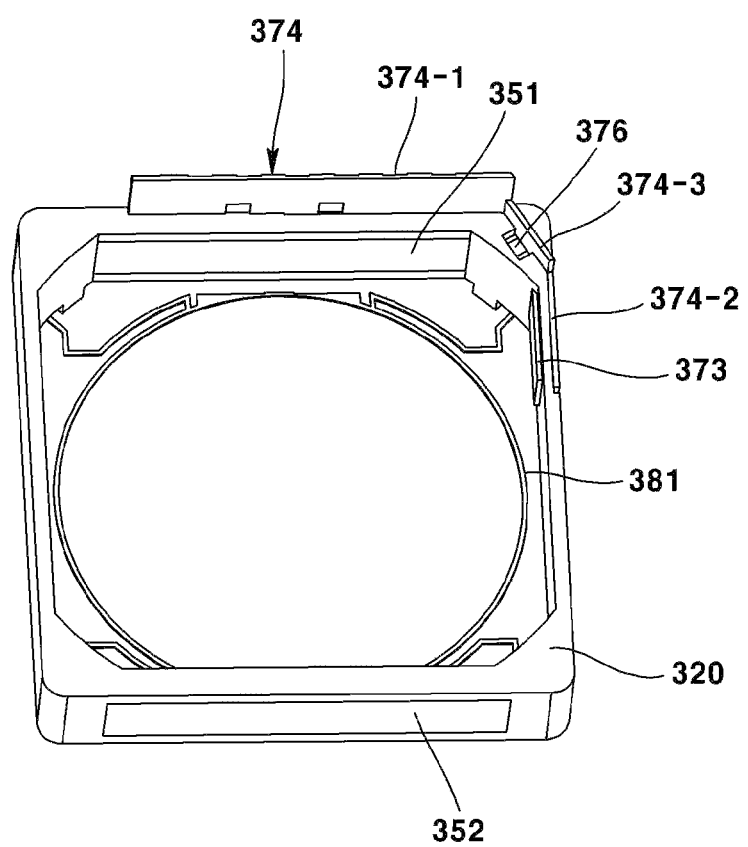
FIG. 13 is a bottom perspective view illustrating a partial configuration of a third camera device according to the present embodiment.
Figure 14:
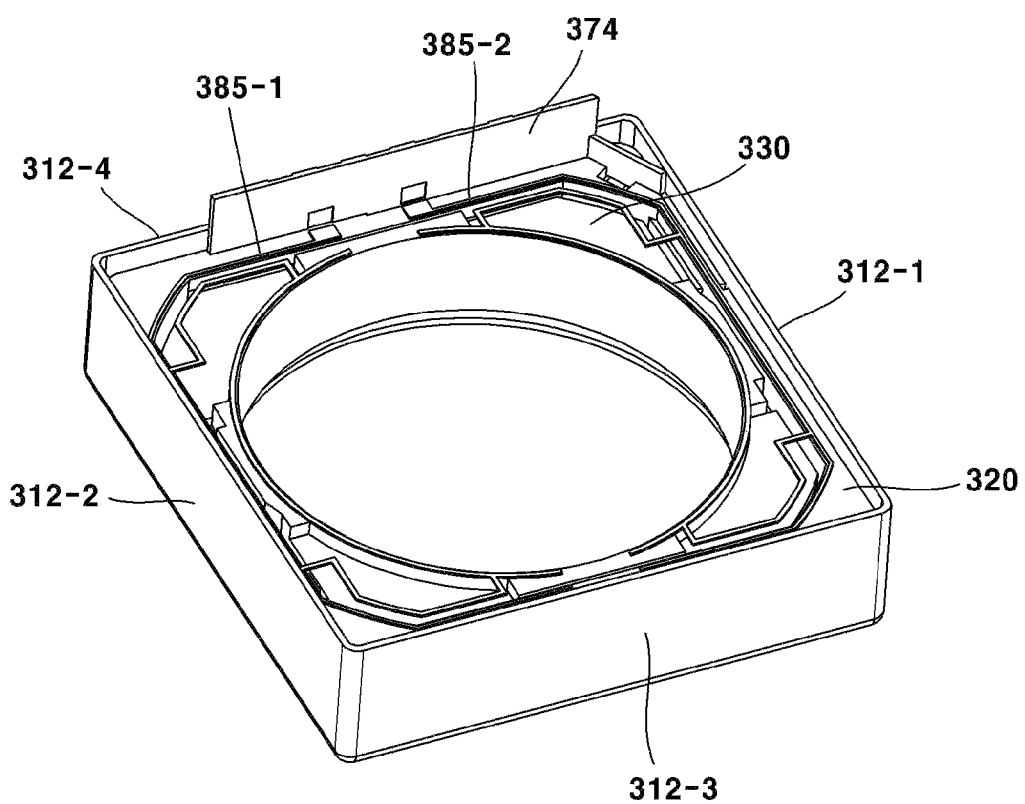
FIG. 14 is a bottom perspective view illustrating a state in which a third bobbin and a second elastic member are additionally coupled to FIG. 13.
Figure 15:
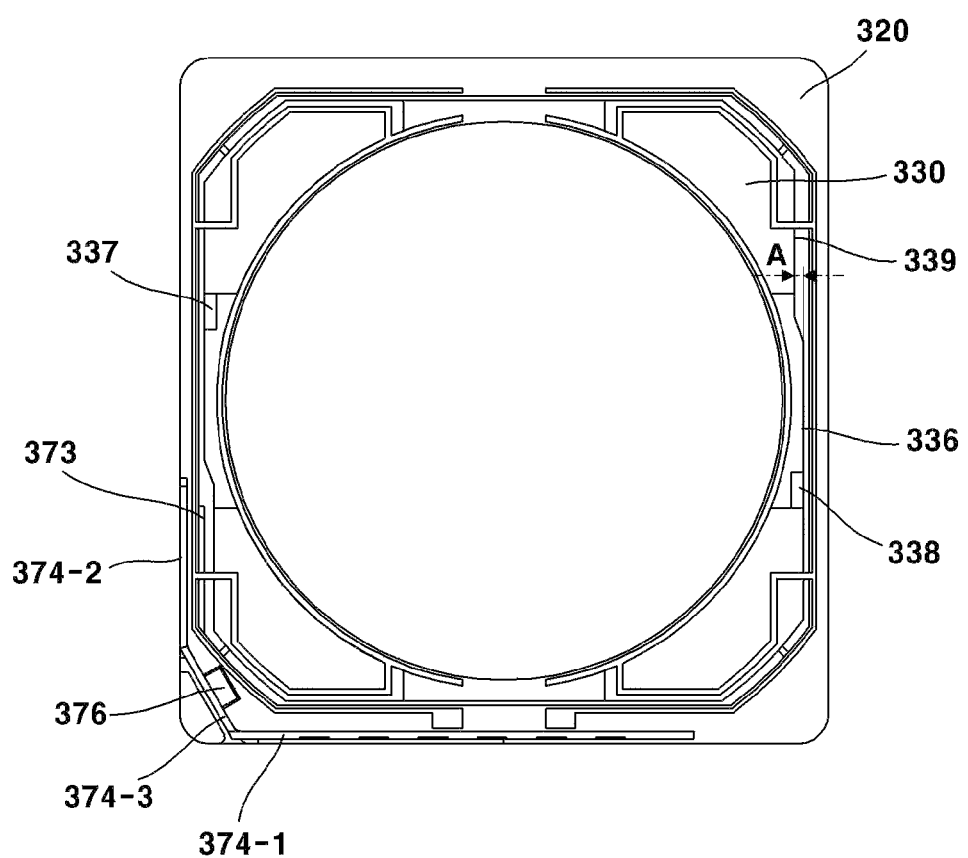
FIG. 15 is a bottom view illustrating a partial configuration of a third camera device according to the present embodiment.
Figure 16:
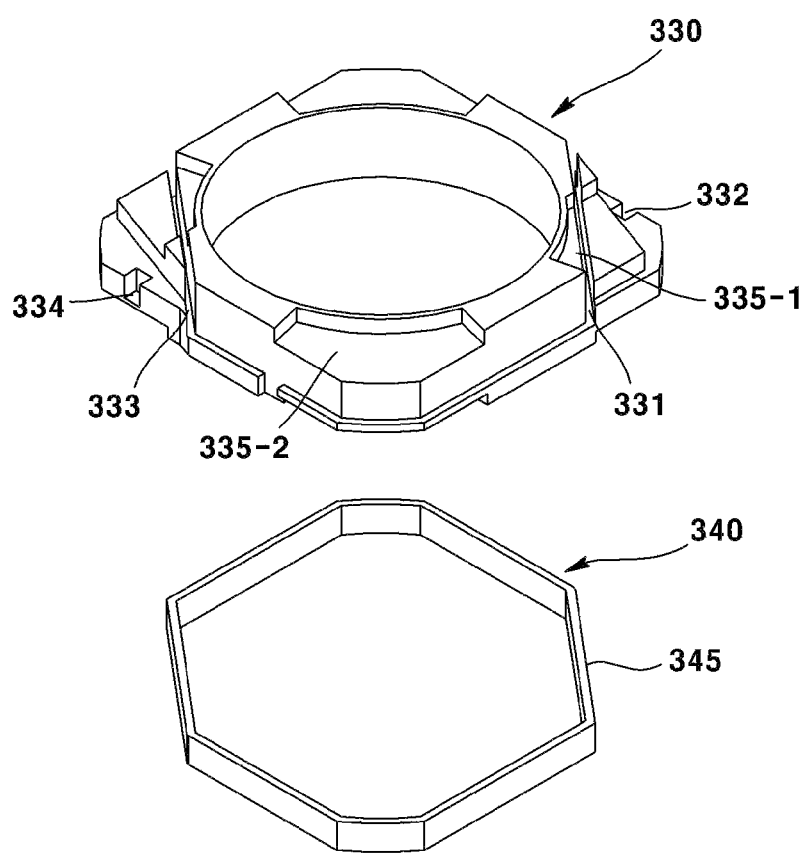
FIG. 16 is an exploded perspective view illustrating a third bobbin and a third coil of a third camera device according to a modified embodiment.
Figure 17:
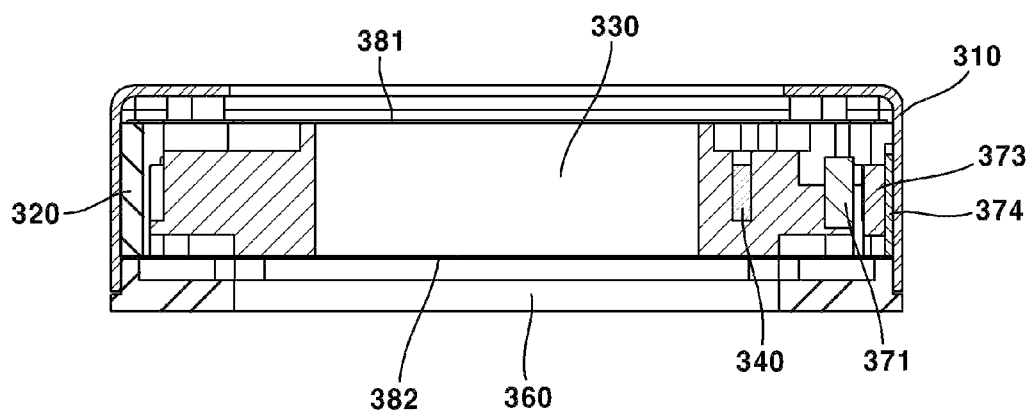
FIG. 17 is a cross-sectional view of a third camera device according to the present embodiment.

FIG. 1 is a see-through view from above of a triple camera device according to the present embodiment; FIG. 2 is a see-through view illustrating a first camera device of FIG. 1; FIG. 3 is a see-through view illustrating a second camera device of FIG. 1; FIG. 4 is a see-through view illustrating a third camera device of FIG. 1; FIG. 5 is a see-through view from above of a triple camera device according to a modified embodiment; FIG. 6 is a perspective view of a third camera device according to the present embodiment; FIG. 7 is an exploded perspective view of a third camera device according to the present embodiment; FIG. 8 is an exploded perspective view illustrating a third coil and a third bobbin of FIG. 7; FIG. 9 is a perspective view illustrating a state in which a third coil and a third bobbin, and a third-second magnet and a third-third magnet of FIG. 8 are coupled; FIG. 10 is an exploded perspective view illustrating a first elastic member, a third housing, and a third-first magnet of FIG. 7; FIG. 11 is a perspective view illustrating a state in which the components of FIG. 10 are coupled; FIG. 12 is a perspective view illustrating a third substrate of FIG. 7; FIG. 13 is a bottom perspective view illustrating a partial configuration of a third camera device according to the present embodiment; FIG. 14 is a bottom perspective view illustrating a state in which a third bobbin and a second elastic member are additionally coupled to FIG. 13; FIG. 15 is a bottom view illustrating a partial configuration of a third camera device according to the present embodiment; FIG. 16 is an exploded perspective view illustrating a third bobbin and a third coil of a third camera device according to a modified embodiment; FIG. 17 is a cross-sectional view of a third camera device according to the present embodiment; and FIG. 18 is a perspective view as viewed from above of a triple camera device according to another modified embodiment.

The camera device may be a "camera module". The camera device may comprise a "lens driving device". The lens driving device may be a "lens driving motor". The lens driving device may be a "voice coil motor (VCM)". The camera device may comprise an "AF actuator". The camera device may comprise an "OIS actuator".

The camera device may comprise a plurality of camera devices. The plurality of camera devices may be triple camera devices. The plurality of camera devices may comprise three camera devices. The plurality of camera devices may comprise two camera devices. The camera device may comprise first to third camera devices 100, 200, and 300. The camera device may comprise a first camera device 100, a second camera device 200, and a third camera device 300 disposed between the first camera device 100 and the second camera device 200. The first camera device 100 is disposed on one side, the second camera device 200 is disposed on the other side, and the third camera device 300 may be disposed between the first camera device 100 and the second camera device 200. The first to third camera devices 100, 200, and 300 may be arranged side by side. The first to third camera devices 100, 200, and 300 may be disposed parallel to each other. The first to third camera devices 100, 200, and 300 may be disposed on a straight line. The first to third camera devices 100, 200, and 300 may face the same direction. The first to third camera devices 100, 200, and 300 may be spaced apart from each other. As a modified embodiment, the first to third camera devices 100, 200, and 300 may be switched to each other.

Figure 18:
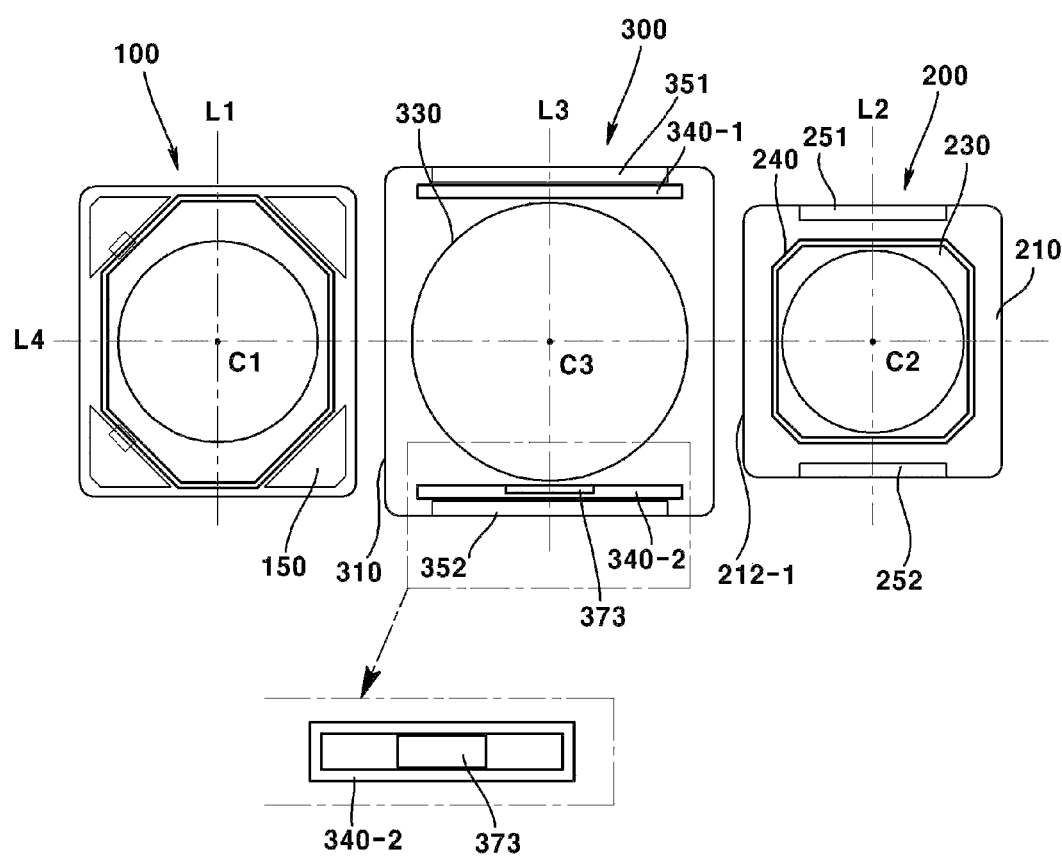
FIG. 18 is a perspective view as viewed from above of a triple camera device according to another modified embodiment.

The first camera device 100 comprises a first optical axis C1, the second camera device 200 comprises a second optical axis C2, and the third camera device 300 may comprise a third optical axis C3 (refer to FIGS. 1, 5, and 18).

Meanwhile, an arbitrary first straight line L1 passing through the first optical axis C1, an arbitrary second straight line L2 passing through the second optical axis C2, and an arbitrary third straight line L3 passing through the third optical axis C3, and an arbitrary fourth straight line L4 passing through the first optical axis C1, the second optical axis C2, and the third optical axis C3 may be illustrated. In this case, a magnet may not be disposed on the fourth straight line L4.

The camera device may comprise the first camera device 100. The first camera device 100 may comprise an OIS module. The first camera device 100 may perform an AF function and an OIS function. The first camera device 100 may be spaced apart from the third camera device 300 and may be disposed on one side of the third camera device 300.

The first camera device 100 may comprise a first cover 110. The first cover 110 may be coupled to a first base. The first cover 110 may accommodate a first housing therein. The first cover 110 may form the appearance of the first camera device 100. The first cover 110 may have a hexahedral shape with an open lower surface. The first cover 110 may be a non-magnetic material. The first cover 110 may be formed of a metal material. The first cover 110 may be formed of a metal sheet material. The first cover 110 may be connected to the ground portion of a first printed circuit board. Through this, the first cover 110 may be grounded. The first cover 110 may block the electromagnetic interference (EMI). In this case, the first cover 110 may be an 'EMI shield can'.

The first cover 110 may comprise a first upper plate 111 and a first lateral plate 112. The first cover 110 may comprise a first upper plate 111 comprising a hole, and a plurality of first lateral plates 112 extending downward from an outer periphery or an edge of the first upper plate 111. The lower end of the first lateral plate 112 may be disposed on a step portion formed on a lateral surface of the first base. The inner surface of the first lateral plate 112 may be coupled to the first base by an adhesive.

The first lateral plate 112 may comprise a plurality of lateral plates. The first lateral plate 112 may comprise four lateral plates. The first lateral plate 112 may comprise a first-first to a first-fourth lateral plates 11second-first, 11second-second, 11second-third, and 11second-fourth. The plurality of first lateral plates 112 may comprise a first-first lateral plate 11second-first opposite to a third cover 310, and a first-second lateral plate 11second-second disposed on the opposite side of the first-first lateral plate 11second-first, a first-third lateral plate 11second-third and a first-fourth lateral plate 11second-fourth disposed opposite to each other between the first-first lateral plate 11second-first and the first-second lateral plate 11second-second, a first-first corner between the first-second lateral plate 11second-second and the first-third lateral plate 11second-third, and a first-second corner between the first-second lateral plate 11second-second and the first-fourth lateral plate 11second-fourth. At this time, a first-first Hall sensor 180-1 is disposed between the first-first corner and the central axis in the vertical direction of the first cover 110, and a first-second Hall sensor 180-2 may be disposed between the first-second corner and the central axis in the vertical direction of the first cover 110.

The first camera device 100 may comprise a first housing (not shown). The first housing may be disposed in the first cover 110. The first housing may be disposed outside a first bobbin 130. The first housing may accommodate at least a portion of the first bobbin 130. The first housing may comprise a hole penetrating the first housing in the optical axis direction, and the first bobbin 130 may be disposed in the hole of the first housing. The first housing may be disposed between the first bobbin 130 and the first cover 110. The first housing may be spaced apart from the first bobbin 130 and the first cover 110. The first housing may be formed of a material different from the first cover 110. The first housing may be formed of an injection product. The first housing can be moved to drive the OIS.

The first camera device 100 may comprise a first bobbin 130. The first bobbin 130 may be disposed in the first housing. The first bobbin 130 may be disposed in the first cover 110. The first bobbin 130 may comprise a hole penetrating the first bobbin 130 in the optical axis direction. A lens may be coupled to the hole of the first bobbin 130. The first bobbin 130 may be movably supported with respect to the first housing by an elastic member. The first bobbin 130 may move integrally with the lens for AF driving and OIS driving.

The first camera device 100 may comprise a first-first coil 140. The first-first coil 140 may be an 'AF driving coil'. The first-first coil 140 may be disposed on the first bobbin 130. The first-first coil 140 may be disposed on an outer circumferential surface of the first bobbin 130. The first-first coil 140 may be directly wound onto the first bobbin 130. Alternatively, the first-first coil 140 may be coupled to the first bobbin 130 in a wound state. The first-first coil 140 may be disposed between the first bobbin 130 and the first housing. The first-first coil 140 may face a first magnet 150. The first-first coil 140 may electromagnetically interact with the first magnet 150. When an electric current is applied to the first-first coil 140 and an electromagnetic field is formed around the first-first coil 140, the first-first coil 140 can move with respect to the first magnet 150 due to the electromagnetic interaction between the first-first coil 140 and the first magnet 150.

The first camera device 100 may comprise a first magnet 150. The first magnet 150 may be disposed in the first housing. The first magnet 150 may be fixed to the first housing by an adhesive. The first magnet 150 may be disposed between the first bobbin 130 and the first housing. The first magnet 150 may face the first-first coil 140. The first magnet 150 may be a 'driving magnet'. The first magnet 150 may be disposed at a corner of the first housing. The first magnet 150 may be a 'corner magnet'. The first magnet 150 may be commonly used for AF driving and OIS driving.

In the present embodiment, it has been described that the first-first coil 140 is disposed on the first bobbin 130 and the first magnet 150 is disposed in the first housing, but in a modified embodiment, the first magnet 150 is disposed on the first bobbin 130 and the first-first coil 140 may be disposed in the first housing.

The first camera device 100 may comprise a first base (not shown). The first base may be disposed under the first housing. The first base may be disposed under a first substrate. On an upper surface of the first base, the first substrate may be disposed. The first base may be coupled with the first cover 110. The first base may be disposed on a first printed circuit board.

The first camera device 100 may comprise a first substrate (not shown). The first substrate may be disposed on the first base. The first substrate may be disposed on the upper surface of the first base. The first substrate may comprise a first-second coil. That is, the first-second coil may be disposed on the first substrate in the form of a pattern coil. However, the first-second coil may be provided separately from the first substrate. The first substrate may be a flexible printed circuit board (FPCB).

The first camera device 100 may comprise a first-second coil (not shown). The first-second coil may be disposed on the first base. The first-second coil may be formed of an fine pattern (FP) coil and may be disposed on a separate FPCB disposed on the upper surface of the first base. The first-second coil may face the first magnet 150. The first-second coil may move the first magnet 150 through the electromagnetic interaction with the first magnet 150. The first-second coil may be an 'OIS driving coil'.

In the present embodiment, it has been described that the first-second coil is disposed on the first base and the first magnet 150 is disposed in the first housing, but in a modified embodiment, the first magnet 150 is disposed on the first base and first-second coil may be disposed in the first housing.

The first camera device 100 may comprise an elastic member (not shown). The elastic member may elastically support the first bobbin 130. The elastic member may movably support the first bobbin 130. The elastic member may connect the first bobbin 130 and the first housing. The elastic member may connect the first bobbin 130 and the first base. The elastic member may comprise an upper elastic member coupled to an upper portion of the first bobbin 130 and a lower elastic member coupled to a lower portion of the first bobbin 130. The elastic member may be a leaf spring.

The first camera device 100 may comprise a support member (not shown). The support member may elastically support the first housing. The support member may movably support the first housing. The support member may connect the upper elastic member of the first housing and the first substrate. Alternatively, the support member may connect the first housing and the first base. The support member may be a wire or a leaf spring. The wire may comprise a plurality of wires. The wires may comprise 4 or 6 or 8 wires. The leaf spring may comprise a plurality of leaf springs. The leaf spring may comprise four leaf springs.

The first camera device 100 may comprise a damper (not shown). The damper may be disposed in the elastic member and/or the support member. Through this, a resonance phenomenon generated in the elastic member and the support member can be inhibited.

The first camera device 100 may comprise a first Hall sensor 180. The first Hall sensor 180 may detect the first magnet 150. The first Hall sensor 180 may detect the magnetic force of the first magnet 150. The first Hall sensor 180 may detect a movement amount and/or a position of the first magnet 150. The first Hall sensor 180 may be a 'driver IC integrated Hall sensor'. The first Hall sensor 180 may comprise a total of four terminals SCL, SDA, VDD, and GND.

The first Hall sensor 180 may comprise a plurality of Hall sensors. The first Hall sensor 180 may comprise a first-first Hall sensor 181 and a first-second Hall sensor 182. The first Hall sensor 180 may comprise a first-first Hall sensor 181 disposed between a first-first corner of the first cover 110 (a corner between the first-second lateral plate 11second-second and the first-third lateral plate 11second-third) and the central axis in the vertical direction of the first cover 110, and a first-second Hall sensor 182 disposed between a first-second corner of the first cover 110 (a corner between the first-second lateral plate 11second-second and the first-fourth lateral plate 11second-fourth) and the central axis in the vertical direction of the first cover 110. The first-first Hall sensor 181 detects the movement of the first magnet 150 in the x-axis direction, and the first-second Hall sensor 182 may detect the movement of the first magnet 150 in the y-axis direction.

The first camera device 100 may comprise a first lens. The first lens may be coupled to the first bobbin 130. The first lens may comprise a plurality of lenses. The plurality of lenses can be coupled to a barrel. A lens module in which the plurality of lenses is coupled to the barrel may be coupled to the inner circumferential surface of the first bobbin 130.

The first camera device 100 may comprise a first image sensor. The first image sensor may be disposed under the first lens. The first image sensor may be disposed on a first printed circuit board. The first image sensor may be coupled to the first printed circuit board by surface mounting technology (SMT). As another example, the first image sensor may be coupled to the first printed circuit board by flip chip technology. The first image sensor may be disposed so that its optical axis is coincided with that of the first lens. The optical axis of the first image sensor and the optical axis of the first lens may be aligned. The first image sensor may convert light irradiated to the effective image area of the first image sensor into an electrical signal. The first image sensor may be any one among a charge coupled device (CCD), a metal oxide semi-conductor (MOS), a CPD, and a CID.

The first camera device 100 may comprise a first filter. The first filter may comprise a first infrared filter. The first infrared filter may block an infrared light from being incident to the first image sensor. The first infrared filter may be disposed between the first lens and the first image sensor. The first infrared filter may be disposed on the first base. Alternatively, the first infrared filter may be disposed on a sensor base separate from the first base.

The first camera device 100 may comprise a first printed circuit board. A first base or a separate sensor base may be disposed on the first printed circuit board. The first printed circuit board may be electrically connected to the first-first coil 140 and the first-second coil. The first printed circuit board may be electrically connected to the first image sensor.

The first camera device 100 may comprise a first control unit. The first control unit may control the direction, intensity, and amplitude of the current applied to the first-first coil 140 and the first-second coil. The first control unit may perform AF driving, OIS driving, AF feedback control, and/or OIS feedback control of the first camera device 100.

The camera device may comprise a second camera device 200. The second camera device 200 may comprise an AF module. The second camera device 200 may perform an AF function. In addition, as a modified embodiment, the second camera device 200 may also perform an OIS function. The second camera device 200 may be spaced apart from the third camera device 300 and disposed at the other side of the third camera device 300 (the opposite side to the one side at which the first camera device 100 is disposed).

The second camera device 200 may comprise a second cover 210. The second cover 210 may be coupled to a second base. The second cover 210 may accommodate the second housing inside. The second cover 210 may form the appearance of the second camera device 200. The second cover 210 may have a hexahedral shape with an open lower surface. The second cover 210 may be a non-magnetic material. The second cover 210 may be formed of a metal material.

The second cover 210 may be formed of a metal sheet material. The second cover 210 may be connected to the ground portion of a second printed circuit board. Through this, the second cover 210 can be grounded. The second cover 210 can block electromagnetic interference noise. In this case, the second cover 210 may be an 'EMI shield can'.

The second cover 210 may comprise a second upper plate 211 and a second lateral plate 212. The second cover 210 may comprise a second upper plate 211 comprising a hole, and a plurality of second lateral plates 212 extending downward from an outer circumference or edge of the second upper plate 211. The lower end of the second lateral plate 212 may be disposed on a step portion formed on a lateral surface of the second base. The inner surface of the second lateral plate 212 may be coupled to the second base by an adhesive.

The second lateral plate 212 may comprise a plurality of lateral plates. The second lateral plate 212 may comprise four lateral plates. The second lateral plate 212 may comprise a second-first to a second-fourth lateral plates 21second-first, 21second-second, 21second-third, and 21second-fourth. The plurality of second lateral plates 212 may comprise a second-first lateral plate 21second-first facing the third-first lateral plate 31second-first, and a second-second lateral plate 21second-second disposed at the opposite side of the second-first lateral plate 21second-first, and a second-third lateral plate 21second-third and a second-fourth lateral plate 21second-fourth disposed opposite to each other between the second-first and second-second lateral plates 21second-first and 21second-second. At this time, a third Hall sensor 373 of the third camera device 300 may be disposed closer to the second-fourth lateral plate 21second-fourth than the second-third lateral plate 21second-third.

The second camera device 200 may comprise a second housing (not shown). The second housing may be disposed in the second cover 210. The second housing may be disposed outside the second bobbin 230. The second housing may accommodate at least a portion of the second bobbin 230. The second housing may comprise a hole passing through the second housing in the optical axis direction, and a second bobbin 230 may be disposed in the hole of the second housing. The second housing may be disposed between the second bobbin 230 and the second cover 210. The second housing may be spaced apart from the second bobbin 230. The second housing may be formed of a material different from the second cover 210. The second housing may be formed of an injection product.

The second camera device 200 may comprise a second bobbin 230. The second bobbin 230 may be disposed in the second cover 210. The second bobbin 230 may be disposed in the second housing. The second bobbin 230 may comprise a hole penetrating the second bobbin 230 in the optical axis direction. A lens may be coupled to the hole of the second bobbin 230. The second bobbin 230 may be movably supported with respect to the second housing by an elastic member. The second bobbin 230 may move integrally with the lens for AF driving.

The second camera device 200 may comprise a second coil 240. The second coil 240 may be an 'AF driving coil'. The second coil 240 may be disposed on the second bobbin 230. The second coil 240 may be disposed on an outer circumferential surface of the second bobbin 230. The second coil 240 may be directly wound on the second bobbin 230. Alternatively, the second coil 240 may be coupled to the second bobbin 230 in a wound state. The second coil 240 may be disposed between the second bobbin 230 and the second housing. The second coil 240 may face a second magnet 250. The second coil 240 may electromagnetically interact with the second magnet 250. When a current is applied to the second coil 240 and an electromagnetic field is formed around the second coil 240, the second coil 240 may move with respect to the second magnet 250 due to the electromagnetic interaction between the second coil 240 and the second magnet 250.

The second camera device 200 may comprise a second magnet 250. The second magnet 250 may be disposed between the second coil 240 and the second cover 210. The second magnet 250 may be disposed in the second housing. The second magnet 250 may be fixed to the second housing by an adhesive. The second magnet 250 may be disposed between the second bobbin 230 and the second housing. The second magnet 250 may face the second coil 240. The second magnet 250 may be a 'driving magnet'. The second magnet 250 can be used for AF driving.

In the present embodiment, it has been described that the second coil 240 is disposed on the second bobbin 230 and the second magnet 250 is disposed in the second housing, but in a modified embodiment, the second magnet 250 is disposed on the second bobbin 230 and the second coil 240 may be disposed in the second housing.

The second magnet 250 may comprise a plurality of magnets. The second magnet 250 may comprise two magnets. The second magnet 250 may comprise a second-first magnet 251 and a second-second magnet 252. The second magnet 250 may comprise a second-first magnet 251 and a second-second magnet 252 spaced apart from each other. The second-first magnet 251 may be disposed closer to the third camera device 300 than the second-second magnet 252. The second magnet 250 may comprise a second-first magnet 251 disposed between the second coil 240 and the second-third lateral plate 21second-third, and a second-second magnet 252 disposed between the second coil 240 and the second-fourth lateral plate 21second-fourth. In the present embodiment, the second-first magnet 251 is disposed closer to the second-first lateral plate 21second-first than the second-second lateral plate 21second-second, and the second-second magnet 252 may be disposed closer to the second-second lateral plate 21second-second than the second-first lateral plate 21second-first. That is, the second-second magnet 252 is disposed to be spaced apart from a third-second magnet 371 as much as possible on a limited space, and the second-first magnet 251 may be disposed to be symmetrical with the second-second magnet 252. Through the aforementioned structure, the influence of the third-second magnet 371 of the third camera device 300 on the second magnet 250 can be minimized. In addition, in the second camera device 200, a magnet may not be disposed between the third camera device 300 and the second bobbin 230. Similarly, the influence of the magnet of the third camera device 300 on the driving of the second camera device 200 can be minimized. As a modified embodiment, the second-first magnet 251 and the second-second magnet 252 may be spaced apart by the same distance to the second-first lateral plate 21second-first and the second-second lateral plate 21second-second (refer to FIG. 18). That is, in the modified embodiment, the second-first magnet 251 and the second-second magnet 252 can be disposed at the center of the second-third lateral plate 21second-third and the second-fourth lateral plate 21second-fourth without being biased to either side.

In the present embodiment, the second magnet 250 may be a flat magnet (refer to FIG. 1). Each of the second-first magnet 251 and the second-second magnet 252 may be a flat magnet comprising a flat plate shape.

In a modified embodiment, the second magnet 250 may be a corner magnet (refer to FIG. 5). Each of the second-first magnet 251 and the second-second magnet 252 may be a corner magnet comprising a plurality of lateral surfaces. In this case, the plurality of lateral surfaces of the corner magnet may comprise two lateral surfaces facing the plurality of second lateral plates 212 and a lateral surface connecting the two lateral surfaces in an inclined manner and facing the second coil 240.

The second camera device 200 may comprise a second base (not shown). The second base may be disposed under the second housing. The second base may be coupled to the second cover 210. The second base may be disposed on the second printed circuit board.

The second camera device 200 may comprise an elastic member (not shown). The elastic member may movably support the second bobbin 230. The elastic member may elastically support the second bobbin 230. The elastic member may connect the second bobbin 230 and the second housing. The elastic member may connect the second bobbin 230 and the second base. The elastic member may comprise an upper elastic member coupled to an upper portion of the second bobbin 230 and a lower elastic member coupled to a lower portion of the second bobbin 230.

The second camera device 200 may comprise a second lens. The second lens may be coupled to the second bobbin 230. The second lens may comprise a plurality of lenses. The plurality of lenses can be coupled to a barrel. A lens module in which the plurality of lenses is coupled to the barrel may be coupled to the inner circumferential surface of the second bobbin 230.

The second camera device 200 may comprise a second image sensor. The second image sensor may be disposed under the second lens. The second image sensor may be disposed on the second printed circuit board. The second image sensor may be coupled to the second printed circuit board by surface mounting technology (SMT). As another embodiment, the second image sensor may be coupled to the second printed circuit board by flip chip technology. The second image sensor may be disposed so that its optical axis is coincided with that of the second lens. The optical axis of the second image sensor and the optical axis of the second lens may be aligned. The second image sensor may convert light irradiated to the effective image area of the second image sensor into an electrical signal. The second image sensor may be any one among a charge coupled device (CCD), a metal oxide semi-conductor (MOS), a CPD, and a CID.

The second camera device 200 may comprise a second filter. The second filter may comprise a second infrared filter. The second infrared filter may block an infrared light from being incident to the second image sensor. The second infrared filter may be disposed between the second lens and the second image sensor. The second infrared filter may be disposed on the second base. Alternatively, the second infrared filter may be disposed on a sensor base separate from the second base.

The second camera device 200 may comprise a second printed circuit board. A second base or a separate sensor base may be disposed on the second printed circuit board. The second printed circuit board may be electrically connected to the second coil 240. The second printed circuit board may be electrically connected to the second image sensor.

The second camera device 200 may comprise a second control unit. The second control unit may control the direction, intensity, and amplitude of the current applied to the second coil 240. The second control unit may perform AF driving, OIS driving, AF feedback control, and/or OIS feedback control of the second camera device 200.

The camera device may comprise a third camera device 300. The third camera device 300 may comprise an AF module. The third camera device 300 may perform an AF function. In addition, as a modified embodiment, the third camera device 300 may also perform an OIS function. The third camera device 300 may be spaced apart from and disposed between the first camera device 100 and the second camera device 200.

The third camera device 300 may comprise a third cover 310. The third cover 310 may be coupled to a third base. The third cover 310 may accommodate the third housing inside. The third cover 310 may form the appearance of the third camera device 300. The third cover 310 may have a hexahedral shape with an open lower surface. The third cover 310 may be a non-magnetic material. The third cover 310 may be formed of a metal material. The third cover 310 may be formed of a metal sheet material. The third cover 310 may be connected to the ground portion of a third printed circuit board. Through this, the third cover 310 can be grounded. The third cover 310 can block electromagnetic interference noise. In this case, the third cover 310 may be an 'EMI shield can'.

The third cover 310 may comprise a third upper plate 311 and a third lateral plate 312. The third cover 310 may comprise a third upper plate 311 comprising a hole, and a plurality of third lateral plates 312 extending downward from an outer circumference or edge of the third upper plate 311. The lower end of the third lateral plate 312 may be disposed on a step portion formed on a lateral surface of a third base 360. The inner surface of the third lateral plate 312 may be coupled to the third base 360 by an adhesive. The plurality of third lateral plates 312 may comprise a third-first lateral plate 31second-first facing the second cover 210 of the second camera device 200.

The third lateral plate 312 may comprise a plurality of lateral plates. The third lateral plate 312 may comprise four lateral plates. The third lateral plate 312 may comprise a third-first to a third-fourth lateral plates 31second-first, 31second-second, 31second-third, and 31second-fourth. The plurality of third lateral plates 312 may comprise a third-first lateral plate 31second-first and a third-second lateral plate 31second-second disposed at the opposite side of the third-first lateral plate 31second-first, and a third-third lateral plate 31second-third and a third-fourth lateral plate 31second-fourth disposed opposite to each other between the third-first and third-second lateral plates 31second-first and 31second-second.

The third camera device 300 may comprise a third housing 320. The third housing 320 may be disposed in the third cover 310. The third housing 320 may be disposed outside a third bobbin 330. The third housing 320 may accommodate at least a portion of the third bobbin 330. The third housing 320 may comprise a hole penetrating the third housing 320 in the optical axis direction, and the third bobbin 330 may be disposed in the hole of the third housing 320. The third housing 320 may be disposed between the third cover 310 and the third bobbin 330. The third housing 320 may be spaced apart from the third bobbin 330. The third housing 320 may be formed of a material different from that of the third cover 310. The third housing 320 may be formed of an injection product. A third-first magnet 350 may be disposed in the third housing 320. The third housing 320 may comprise a protrusion 321. The protrusion 321 may be formed on the upper surface of the third housing 320. A first elastic member 381 may comprise a groove having a shape corresponding to the protrusion 321. The protrusion 321 of the third housing 320 may be inserted into a corresponding groove of the first elastic member 381.

The third camera device 300 may comprise a third bobbin 330. The third bobbin 330 may be disposed in the third cover 310. The third bobbin 330 may be disposed in the third housing 320. The third bobbin 330 may comprise a hole penetrating the third bobbin 330 in the optical axis direction. A lens may be coupled to the hole of the third bobbin 330. The third bobbin 330 may be movably supported with respect to the third housing 320 by an elastic member. The third bobbin 330 may move integrally with the lens for AF driving. The third coil 340 may be manufactured and assembled separately from the third bobbin 330. The third bobbin 330 may have a first groove 331 and a first surface 33first-first to which the third coil 340 is assembled. Outside the assembly surface of the third coil 340 of the third bobbin 330, a groove portion (a second groove 332, a fourth groove 334) in which the third-second magnet 371 and a third-third magnet 372 are assembled may be disposed.

The third bobbin 330 may comprise a first lateral surface facing a third-first-first magnet 351 and a second lateral surface facing a third-first-second magnet 352. In this case, a third-first coil may be disposed on the first lateral surface of the third bobbin 330 and a third-second coil may be disposed on the second lateral surface of the third bobbin 330. The third bobbin 330 may comprise a hole penetrating the third bobbin 330 in the optical axis direction, a first lateral surface facing the third-first lateral plate 31second-first, and a third-second lateral plate 31second-second, a second lateral surface facing the third-third lateral plate 31second-third, and a fourth lateral surface facing the third-fourth lateral plate 31second-fourth.

The third bobbin 330 may comprise a first groove 331. The first groove 331 may be formed between the hole of the third-second magnet 371 and the third bobbin 330. At least a portion of the third coil 340 may be disposed in the first groove 331. In the present embodiment, the first groove 331 may be formed to have an inclination with the first lateral surface of the third bobbin 330 and the fourth lateral surface of the third bobbin 330.

The first groove 331 may comprise a first surface 33first-first facing the inner surface of the third coil 340, a second surface facing the lower surface of the third coil 340, and a third surface coil facing the outer surface of the third coil 340. In the present embodiment, the first surface 33first-first of the first groove 331 may also form an obtuse angle with the first lateral surface of the third bobbin 330 (refer to FIG. 8). The first surface 33first-first of the first groove 331 may form an obtuse angle with the fourth lateral surface of the third bobbin 330. However, the angle between the first surface 33first-first and the first lateral surface may be different from the angle between the first surface 33first-first and the fourth lateral surface (refer to FIG. 8). In a modified embodiment, the first surface 33first-first of the first groove 331 may form an angle of 135 degrees with the first lateral surface of the third bobbin 330 (see FIG. 16). In a modified embodiment, the first surface 33first-first of the first groove 331 may form an angle of 135 degrees with the fourth lateral surface of the third bobbin 330.

The third bobbin 330 may comprise a second groove 332. The second groove 332 may be formed between the first groove 331 and the third-first lateral plate 31second-first of the third cover 310. The second groove 332 may be formed between the first groove 331 and the first lateral surface (the outer circumferential surface of the third bobbin 330 in a corresponding region of the first groove 331). The second groove 332 may be disposed between the first groove 331 and a fifth lateral surface 339. A third-second magnet 371 may be disposed in the second groove 332.

The third bobbin 330 may comprise a third groove 333. The third groove 333 may be symmetrical with respect to the first groove 331 and the optical axis. The third groove 333 may be formed between the third-third magnet 372 and the hole of the third bobbin 330. At least a portion of the third coil 340 may be disposed in the third groove 333. In the present embodiment, the third groove 333 may be formed to have an inclination with the second lateral surface of the third bobbin 330 and the third lateral surface of the third bobbin 330.

The third bobbin 330 may comprise a fourth groove 334. The fourth groove 334 may be symmetrical with respect to the second groove 332 and the optical axis. The fourth groove 334 may be formed between the third groove 333 and the third-second lateral plate 31second-second of the third cover 310. The fourth groove 334 may be formed between the third groove 333 and the second lateral surface (the outer circumferential surface of the third bobbin 330 in a corresponding region of the third groove 333). A third-third magnet 372 may be disposed in the second groove 332.

The third bobbin 330 may comprise a stepped portion 335. The stepped portion 335 may be formed by recessing a portion of the upper surface of the third bobbin 330. The stepped portion 335 may be overlapped with a connecting portion 384 of the first elastic member 381 in the optical axis direction. The stepped portion 335 may provide a space for securing a moving space of the connecting portion 384 of the first elastic member 381.

The stepped portion 335 may comprise a first stepped portion 335-1 formed between the first lateral surface and the fourth lateral surface of the third bobbin 330, and a second step portion 335-2 formed between the second lateral surface and the fourth lateral surface of the third bobbin 330. The first stepped portion 335-1 may be disposed in a first corner of the third bobbin 330. The second stepped portion 335-2 may be disposed in a second corner of the third bobbin 330. At this time, the corner of the third bobbin 330 may be disposed at a position corresponding to the corner of the third cover 310. At this time, the shape of the first stepped portion 335-1 may be different from the shape of the second stepped portion 335-2. The first stepped portion 335-1 may comprise a narrower upper surface than the second stepped portion 335-2 due to the first groove 331. An area of the upper surface of the first stepped portion 335-1 may be smaller than an area of the upper surface of the second stepped portion 335-2.

The third bobbin 330 may comprise a support portion 336. The support portion 336 may be protruded from a plurality of lateral surfaces of the third bobbin 330. The support portion 336 may support the lower end of the third coil 340. The lower end of the third coil 340 may be disposed on the support portion 336. A fifth groove 337 and a sixth groove 338 may be formed in the support portion 336.

The third bobbin 330 may comprise a fifth groove 337 and a sixth groove 338. The fifth groove 337 may be formed in the support portion 336. The sixth groove 338 may be formed on the opposite side of the fifth groove 337. The sixth groove 338 may be symmetrical with respect to the fifth groove 337 and the optical axis. The third coil 340 comprises two lead lines, and the two lead lines of the third coil 340 may be respectively connected to the two elastic units through the fifth groove 337 and the sixth groove 338. That is, the first lead line of the third coil 340 is connected to a first elastic unit 385-1 through the fifth groove 337, and the second lead line of the third coil 340 may be connected to a second elastic unit 385-2 through the sixth groove 338.

The third bobbin 330 may comprise a fifth lateral surface 339. The fifth lateral surface 339 may be formed on the first lateral surface of the third bobbin 330. The fifth lateral surface 339 may be disposed more toward the inner side than the lateral surface of the support portion 336 formed on the first lateral surface of the third bobbin 330. The fifth lateral surface 339 may face the third Hall sensor 373. The fifth lateral surface 339 may be formed to be recessed so as not to contact the protruded portion of the third Hall sensor 373. The fifth lateral surface 339 may be recessed by a predetermined distance (refer to A of FIG. 15) than the support portion 336 formed on the first lateral surface of the third bobbin 330. At this time, the predetermined distance may be 0.1 to 0.3 mm. If it is less than 0.1 mm, the possibility of mechanical interference increases, and if it exceeds 0.3 mm, the Hall output detected by the third Hall sensor 373 may be lowered. A second groove 332 may be formed in the fifth lateral surface 339. The second groove 332 may be recessed from the fifth lateral surface 339. At this time, the outer surface of the third-second magnet 371 disposed in the second groove 332 may be disposed on the same plane as the fifth lateral surface 339.

The third camera device 300 may comprise a third coil 340. The third coil 340 may be an 'AF driving coil'. The third coil 340 may be disposed on the third bobbin 330. The third coil 340 may be disposed on the outer circumferential surface of the third bobbin 330. In the present embodiment, the third coil 340 may be coupled to the third bobbin 330 in a wound state. The third coil 340 may be disposed between the third bobbin 330 and the third housing 320. The third coil 340 may face the third-first magnet 350. The third coil 340 may electromagnetically interact with the third-first magnet 350. When an electric current is applied to the third coil 340 and an electromagnetic field is formed around the third coil 340, the third coil 340 may move with respect to the third-first magnet 350 due to an electromagnetic interaction between the third coil 340 and the third-first magnet 350.

The third coil 340 may comprise first to eighth portions arranged in an octagonal shape. The first portion may connect the second portion and the eighth portion, and the third portion may connect the second portion and the fourth portion. At this time, the length of the second portion may be longer than the length of the third portion. The third-second magnet 371 may be disposed outside the first portion of the third coil 340.

The third coil 340 may be integrally formed. However, the third coil 340 may comprise a plurality of portions. The third coil 340 may comprise first to fourth portions 341, 342, 343 and 344. The third coil 340 may be formed by repeatedly placing the first to fourth portions 341, 342, 343 and 344 two times. That is, each of the first to fourth portions 341, 342, 343 and 344 of the third coil 340 may be disposed in two so as to be symmetrical with respect to the center of the third coil. The first portion 341 of the third coil 340 may be disposed on the fourth lateral surface of the third bobbin 330. The second portion 342 of the third coil 340 may be disposed on the first lateral surface of the third bobbin 330. The third portion 343 of the third coil 340 may connect the first portion 341 and the second portion 342 and may be disposed in the first groove 331 of the third bobbin 330. The fourth portion 344 of the third coil 340 may be disposed at a corner connecting the first lateral surface and the third lateral surface of the third bobbin 330. In the present embodiment, the third portion 343 may form an obtuse angle with the first portion 341. The third portion 343 may form an obtuse angle with the second portion 342. The angle between the third portion 343 and the first portion 341 and the angle between the third portion 343 and the second portion 342 may be different (refer to FIG. 8). However, a curved surface may be formed at at least a portion of a point where the third portion 343 and the first portion 341 are connected and/or a point where the third portion 343 and the second portion 342 are connected. In a modified example, the fifth portion 345 of the third coil 340 can be seen as a modified third portion 343 of the third coil 340 in the present embodiment. The fifth portion 345 may form an angle of 135 degrees from both sides of the adjacent third coil 340 (refer to FIG. 16).

The third coil 340 may comprise a third-first coil disposed on the first lateral surface of the third bobbin 330 and a third-second coil disposed on the second lateral surface of the third bobbin 330. In a modified embodiment, each of the third-first coil and the third-second coil may be disposed so that the currents in the upper portion and lower portion flow in different directions with reference to the respective centers. For example, the lower portion of the outer circumferential surface of the third bobbin 330 is wound with the third coil 340 in one direction, and the upper portion of the outer circumferential surface of the third bobbin 330 is wound with the third coil 340 in the other direction (opposite to one direction), and thereby the third-first coil and the third-second coil may be disposed on the third bobbin 330. Alternatively, the third-first coil 340-1 may be disposed in the form of a 'spectacle coil' by repeatedly winding the third coil 340 from the upper portion to the lower portion and from the lower portion to the upper portion with reference to the center of the first lateral surface on the first lateral surface of the third bobbin 330. The third-second coil 340-2 may be disposed in the form of a ' spectacle coil' by repeatedly winding the third coil 340 from the upper portion to the lower portion and from the lower portion to the upper portion with reference to the center of the second lateral surface on the second lateral surface of the third bobbin 330 (refer to FIG. 18). At this time, a third Hall sensor 373 may be disposed in the third-second coil 340-2. In this case, the third Hall sensor 373 may detect the magnetic force of the third-first-second magnet 352. In a modified embodiment, each of the third-first-first magnet 351 and the third-first-second magnet 352 may have different upper and lower polarities. That is, the winding direction of the third coil 340 and the polarity of the area facing each other in the third-first magnet 350 may be disposed to correspond to each other. Through this structure, the length (height) of the facing surface (surface facing the third coil 340, the inner surface) of the third-first magnet 350 in the z direction may be reduced compared to the case of single polarity.

The third camera device 300 may comprise a third-first magnet 350. The third-first magnet 350 may be disposed between the third coil 340 and the third cover 310. The third-first magnet 350 may be disposed between the third coil 340 and the third lateral plate 312 of the third cover 310. The third-first magnet 350 may be disposed in the third housing 320. The third-first magnet 350 may be fixed to the third housing 320 by an adhesive. The third-first magnet 350 may be disposed between the third bobbin 330 and the third housing 320. The third-first magnet 350 may face the third coil 340. The third-first magnet 350 may be a 'driving magnet'. The third-first magnet 350 may be used for AF driving. The size of the third-first magnet 350 may be larger than the size of the second magnet 250.

In the present embodiment, it has been described that the third coil 340 is disposed in the third bobbin 330 and the third-1 magnet 350 is disposed in the third housing 320, but in a modified embodiment, the third-first magnet 350 may be disposed in the third bobbin 330 and the third coil 340 may be disposed in the third housing 320.

The third-first magnet 350 may comprise a plurality of magnets. The third-first magnet 350 may comprise two magnets. The third-first magnet 350 may comprise a third-first-first magnet 351 and a third-first-second magnet 352. The third-first magnet 350 may comprise a third-first-first magnet 351 disposed between the third coil 340 and the third-third lateral plate 31second-third, and a third-first-second magnet 352 disposed between the third coil 340 and the third-fourth lateral plate 31second-fourth. The third-first-first magnet 351 may be disposed between the third-third lateral plate 31second-third of the third cover 310 and the third lateral surface of the third bobbin 330. The third-first-second magnet 352 may be disposed between the third-fourth lateral plate 31second-fourth of the third cover 310 and the fourth lateral surface of the third bobbin 330. In the present embodiment, the third-first magnet 350 may not be disposed between the third-first lateral plate 31second-first of the third cover 310 and the first lateral surface of the third bobbin 330, and between the third-second lateral plate 31second-second of the third cover 310 and the second lateral surface of the third bobbin 330. That is, the magnet 350 may not be disposed on the third-first lateral plate 31second-first facing the third-second magnet 371 and the third-second lateral plate 31second-second facing the third-third magnet 372. Through this, magnetic interference between the third-first to third-third magnets 350, 371, and 372 can be minimized.

The third camera device 300 may comprise a third base 360. The third base 360 may be disposed under the third housing 320. The third base 360 may be coupled to the third cover 310. The third base 360 may be disposed on the third printed circuit board.

The third camera device 300 may comprise a third-second magnet 371. The third-second magnet 371 may be detected by the third Hall sensor 373. The third-second magnet 371 may be a 'sensing magnet'. The third-second magnet 371 may be disposed on the third bobbin 330. The third-second magnet 371 may be disposed in the second groove 332 of the third bobbin 330. The outer surface of the third-second magnet 371 may be disposed on one plane with the fifth lateral surface 339 of the third bobbin 330. The third-second magnet 371 may be disposed closer to the third-fourth lateral plate 31second-fourth than the third-third lateral plate 31second-third. The third-second magnet 371 may be disposed closer to the third-first-second magnet 352 than the third-first-first magnet 351. That is, the third-second magnet 371 may not be spaced apart by the same distance from the third-first-first magnet 351 and the third-first-second magnet 352, but may be biased toward one side. At this time, the third-third magnet 372 may be disposed closer to the third-first-first magnet 351 than the third-first-second magnet 352.

The third camera device 300 may comprise a third-third magnet 372. The third-third magnet 372 may be disposed on the third bobbin 330. The third-third magnet 372 may be disposed between the first camera device 100 and the third bobbin 330. The third-third magnet 372 may be disposed to achieve magnetic force equilibrium with the third-second magnet 371. That is, the third-third magnet 372 may be disposed to compensate for the third-second magnet 371. The third-third magnet 372 may be a 'compensation magnet'. The third-third magnet 372 may be formed in a shape corresponding to the third-second magnet 371. The third-third magnet 372 may be formed to have a size corresponding to the third-second magnet 371. The third-third magnet 372 may have a polarity corresponding to the third-second magnet 371. The third-third magnet 372 may be disposed at a position corresponding to the third-second magnet 371. The third-third magnet 372 may be symmetrical with the third-second magnet 371 with reference to the central axis of the third bobbin 330 in the vertical direction. The third-third magnet 372 may be symmetrical with reference to the third-second magnet 371 and the optical axis. Through this, the influence of the magnetic force that the third-third magnet 372 exerts on the driving and the like of the camera device can be minimized.

The third camera device 300 may comprise a third Hall sensor 373. The third Hall sensor 373 may detect the third-second magnet 371. The third Hall sensor 373 may face the third-second magnet 371. As a modified embodiment, the third Hall sensor 373 may be disposed on the opposite surface of the third substrate 374 facing the third-second magnet 371. The third Hall sensor 373 may be disposed at a position corresponding to the third-second magnet 371. The third Hall sensor 373 may be disposed on the third substrate 374. The third Hall sensor 373 may be electrically connected to the third substrate 374. The third Hall sensor 373 may be coupled to the third substrate 374 by soldering. At least a portion of the third Hall sensor 373 may be protruded from the inner surface of the third housing 320. The protruding portion of the third Hall sensor 373 may be disposed on an extended line or an extended plane of the outermost surface of the third coil 340. At this time, the first lateral surface of the third bobbin 330 may comprise a fifth lateral surface 339 that is an area recessed in a portion corresponding to the protruding portion of the third Hall sensor 373. The third Hall sensor 373 may be a 'driver IC integrated Hall sensor'. The third Hall sensor 373 may comprise a total of four terminals SCL, SDA, VDD, and GND. The third Hall sensor 373 may have a shape that one lateral surface thereof is fixed by a stopper of the third housing 320 and the other lateral surface thereof is more protruded than an inner surface of the third housing 320.

In the present embodiment, the third Hall sensor 373 may be disposed between the third-second magnet 371 and the second camera device 200. The third Hall sensor 373 may be disposed between the third-second magnet 371 and the third-first lateral plate 31second-first. Through the arrangement structure of the magnet and the Hall sensor mentioned above, the influence of the magnetic force that the third-second magnet 371 exerts on the driving magnets of the first to third camera devices 100, 200, and 300 can be minimized.

The third camera device 300 may comprise a third substrate 374. The third substrate 374 may be disposed between the third bobbin 330 and the third lateral plate 312 of the third cover 310. The third substrate 374 may be disposed in the third housing 320. The third substrate 374 may be inserted into and fixed to a corresponding shape of the third housing 320.

The third substrate 374 may comprise a plurality of portions. The third substrate 374 may comprise first to third portions 37fourth-first, 37fourth-second, and 374-3. The third substrate 374 may comprise a first portion 37fourth-first disposed on the third-first lateral plate 31second-first of the third cover 310, a second portion 37fourth-second disposed on the third-third lateral plate 31second-third of the third cover 310, and a third portion 374-3 connecting the first portion 37fourth-first and the second portion 37fourth-second. A plurality of terminals 375 which is electrically connected to the third coil 340 and the third Hall sensor 373 may be disposed at the lower end of the first portion 37fourth-first. A third Hall sensor 373 may be disposed on the inner surface of the second portion 37fourth-second. A capacitor 376 may be disposed on the inner surface of the third portion 374-3. The first to third portions 37fourth-first, 37fourth-second, and 374-3 may be disposed at different heights from each other. The third portion 374-3 may be disposed higher than the first portion 37fourth-first, and the second portion 37fourth-second may be disposed higher than the third portion 374-3. A lower surface of the third-first magnet 350 may be disposed on the upper surface of the first portion 37fourth-first. The third substrate 374 may be formed by bending a plurality of times. The third substrate 374 may be an FPCB.

The third camera device 300 may comprise a capacitor 376. The capacitor 376 may minimize a voltage drop phenomenon. Through this, the capacitor 376 may inhibit initialization of the driver IC of the third Hall sensor 373. The capacitor 376 may be disposed in a lower groove of the diagonal portion (corner portion) of the third housing 320.

The third camera device 300 may comprise an elastic member 380. The elastic member 380 may movably support the third bobbin 330. The elastic member 380 may elastically support the third bobbin 330.

The elastic member 380 may comprise a first elastic member 381 and a second elastic member 385.

The first elastic member 381 may connect the upper portion of the third bobbin 330 and the upper portion of the third housing 320. The first elastic member 381 may be coupled to the upper surface of the third bobbin 330 and the upper surface of the third housing 320. The first elastic member 381 may be an 'upper elastic member'. The first elastic member 381 may be a leaf spring.

The first elastic member 381 comprises an inner side portion 382 being coupled to an upper portion of the third bobbin 330, an outer side portion 383 being coupled to an upper portion of the third housing 320, and a connecting portion 384 connecting the inner side portion 382 and the outer side portion 383.

The second elastic member 385 may be coupled to the lower portion of the third bobbin 330. The second elastic member 385 may be coupled to the lower surface of the third bobbin 330. The second elastic member 385 may be a 'lower elastic member'. The second elastic member 385 may be fixed between the third housing 320 and the third base 360. The second elastic member 385 may comprise an inner side portion coupled to the lower portion of the third bobbin 330, an outer side portion coupled to the lower surface of the third housing 320 and/or the upper surface of the third base 360, and a connecting portion connecting the inner side portion and the outer side portion.

The second elastic member 385 may comprise two elastic units spaced apart from each other. The second elastic member 385 may comprise first and second elastic units 385-1 and 385-2. Each of the first and second elastic units 385-1 and 385-2 may be connected to the third coil 340. More specifically, one of the lead lines on both sides of the third coil 340 may be connected to the first elastic unit 385-1 and the other lead line may be connected to the second elastic unit 385-2. In addition, each of the first and second elastic units 385-1 and 385-2 may be connected to the third substrate 374. More specifically, the first elastic unit 385-1 is connected to the first terminal formed on the inner surface of the third substrate 374, and the second elastic unit 385-2 may be connected to a second terminal formed on the inner surface of the third substrate 374. That is, in the present embodiment, two elastic units of the second elastic member 385 may be used to electrically connect the third coil 340 and the third substrate 374.

The third camera device 300 may comprise a third lens. The third lens may be coupled to the third bobbin 330. The third lens may comprise a plurality of lenses. The plurality of lenses can be coupled to the barrel. A lens module in which a plurality of lenses is coupled to the barrel may be coupled to the inner circumferential surface of the third bobbin 330.

The third camera device 300 may comprise a third image sensor. The third image sensor may be disposed under the third lens. The third image sensor may be disposed on the third printed circuit board. The third image sensor may be coupled to the third printed circuit board by surface mounting technology (SMT). As another embodiment, the third image sensor may be coupled to the third printed circuit board by flip chip technology. The third image sensor may be disposed so that its optical axis is coincided with that of the third lens. The optical axis of the third image sensor and the optical axis of the third lens may be aligned. The third image sensor may convert light irradiated to the effective image area of the third image sensor into an electrical signal. The third image sensor may be any one among a charge coupled device (CCD), a metal oxide semi-conductor (MOS), a CPD, and a CID.

The third camera device 300 may comprise a third filter. The third filter may comprise a third infrared filter. The third infrared filter may block an infrared light from being incident to the third image sensor. The third infrared filter may be disposed between the third lens and the third image sensor. The third infrared filter may be disposed on the third base. Alternatively, the third infrared filter may be disposed on a sensor base separate from the third base.

The third camera device 300 may comprise a third printed circuit board. A third base or a separate sensor base may be disposed on the third printed circuit board. The third printed circuit board may be electrically connected to the third coil 340. The third printed circuit board may be electrically connected to the third image sensor.

The third camera device 300 may comprise a third control unit. The third control unit may control the direction, intensity, and amplitude of the current applied to the third coil 340. The third control unit may perform AF driving, OIS driving, AF feedback control, and/or OIS feedback control of the third camera device 300.

In the present embodiment, each of the first bobbin 130 of the first camera device 100, the second bobbin 230 of the second camera device 200, and the third bobbin 330 of the third camera device 300 may contain a hole. At this time, a lens module may be coupled to each hole. Meanwhile, the inner diameter of the third bobbin 330 may be larger than the inner diameter of the first bobbin 130 and the inner diameter of the second bobbin 230. That is, the third bobbin 330 may accommodate a lens having a relatively larger diameter than the first bobbin 130 and the second bobbin 230. The size of the third bobbin 330 may be larger than the size of the first bobbin 130 and the size of the second bobbin 230. The size of the third coil 340 may be larger than the size of the first-first coil 140 and the size of the second coil 240.

In the present embodiment, the virtual first straight line may pass through the optical axis of the first camera device 100, the optical axis of the second camera device 200, and the optical axis of the third camera device 300 when viewed from the upper surface or the upper side. The first magnet 150, the second magnet 250, the third-first magnet 350, and the third-second magnet 371 may not be disposed on the virtual first straight line. The first to third camera devices 100, 200, and 300 may be disposed such that the optical axis is positioned on a same line. Magnets of each of the first to third camera devices 100, 200, and 300 may not be overlapped on the same line. Magnets of each of the first to third camera devices 100, 200, and 300 may be spaced apart from the same line.

The present embodiment has been described as an embodiment in which all the first to third camera devices 100, 200, and 300 are disposed together, but as a modified embodiment, only the first and second camera devices 100 and 200 are disposed, or as another modified embodiment, only the first and third camera devices 100 and 300 are disposed, or as yet another modification, only the second and third camera devices 200 and 300 may be disposed. Further, an additional camera device may be disposed with the first to third camera devices 100, 200, and 300.

In another modified embodiment in which the first and the third camera devices 100 and 300 are disposed, the first camera device 100 may comprise: a first cover 110; a first housing 120 disposed in the first cover 110; a first bobbin 130 disposed in the first housing 120; a first-first coil 140 disposed on the first bobbin 130; a first magnet 150 disposed in the first housing 120 and facing the first-first coil 140; a first base 160 disposed under the first housing 120; and a first-second coil 170 disposed on the first base 160 and facing the first magnet 150. The third camera device 300 may comprise: a third cover 310; a third bobbin 330 disposed in the third cover 310; a third coil 340 disposed on the third bobbin 330; a third-first magnet 350 disposed between the third coil 340 and the third cover 310 and facing the third coil 340; a third-second magnet 371 disposed on the third bobbin 330; and a third Hall sensor 373 detecting the third-second magnet 371. The third cover 310 may comprise a third upper plate 311 comprising a hole, and a plurality of third lateral plates 312 extending downward from the third upper plate 311. The plurality of third lateral plates 312 may comprise: a third-second lateral plate 31second-second facing the first cover 110; and a third-first lateral plate 31second-first disposed on the opposite side of the third-second lateral plate 31second-second. The third Hall sensor 373 may be disposed between the third-second magnet 371 and the third-first lateral plate 31second-first. In another modified embodiment in which the second and third camera devices 200 and 300 are disposed, the second camera device 200 may comprise: a second cover 210; a second bobbin 230 disposed in the second cover 210; a second coil 240 disposed on the second bobbin 230; and a second magnet 250 disposed between the second coil 240 and the second cover 210 and facing the second coil 240. The third camera device 300 may comprise: a third cover 310; a third bobbin 330 disposed in the third cover 310; a third coil 340 disposed on the third bobbin 330; a third-first magnet 350 disposed between the third coil 340 and the third cover 310 and facing the third coil 340; a third-second magnet 371 disposed on the third bobbin 330; and the third Hall sensor 373 detecting the third-second magnet 371. The third cover 310 comprises: a third upper plate 311 comprising a hole; and a plurality of third lateral plates 312 extending downward from the third upper plate 311, wherein the plurality of third lateral plates 312 may comprise a third-first lateral plate 31second-first facing the second cover 210. The third Hall sensor 373 may be disposed between the third-second magnet 371 and the third-first lateral plate 31second-first. The second cover 210 may comprise: a second upper plate 211 comprising a hole; and a plurality of second lateral plates 212 extending downward from the second upper plate 211. The plurality of second lateral plates 212 may comprise: a second-first lateral plate 21second-first facing the third-first lateral plate 31second-first; a second-second lateral plate 21second-second disposed on the opposite side of the second-first lateral plate 21second-first; and a second-thirdrd lateral plate 21second-third and a second-fourthth lateral plate 21second-fourth disposed opposite each other between the second-first and second-second lateral plates 21second-first and 21second-second. The third Hall sensor 373 may be disposed closer to the second-fourth lateral plate 21second-fourth than the second-thirdrd lateral plate 21second-third. The second magnet 250 may comprise: a second-first magnet 251 disposed between the second coil 240 and the second-third lateral plate 21second-third; and a second-second magnet 252 disposed between the second coil 240 and the second-fourth lateral plate 21second-fourth. The second-first magnet 251 is disposed closer to the second-first lateral plate 21second-first than the second-second lateral plate 21second-second, and the second-second magnet 252 may be disposed closer to the second-second lateral plate 21second-second than the second-first lateral plate 21second-first.

In the above description, all components constituting the embodiments of the present invention are described as being combined or operating in combination, but the present invention is not necessarily limited to the embodiments. In other words, within the scope of the purpose of this invention, all of those components may operate in selective combinations of one or more components. In addition, the term "include", "comprise", or "have" described above means that the corresponding components can be embedded unless there is an opposite description therefore it should be interpreted that other components may further be comprised in addition to those corresponding components. All terms, including technical and scientific terms, have the same meaning as commonly understood by one of ordinary skill in the art to which this invention belongs, unless otherwise defined. Commonly used terms, such as predefined terms, should be interpreted to be consistent with the contextual meanings of the related art, and are not to be construed as ideal or excessively formalistic, unless expressly defined to the contrary.

The above description is only to those described as the technical idea of the present invention by way of an example, and those skilled in the art will appreciate that various modifications and variations can be made without departing from the essential features of the present invention. Therefore, the embodiments disclosed in the present invention are not intended to limit the technical idea of the present invention but to describe the present invention, and the scope of the technical idea of the present invention is not limited by these embodiments. The protection scope of the present invention should be interpreted by the following claims, and all technical ideas within the equivalent scope should be interpreted as being included in the scope of the present invention.

The invention claimed is:

1. A camera device comprising:
a first camera device and a second camera device,
wherein the first camera device comprises a first cover, a first bobbin disposed in the first cover, a first coil disposed on the first bobbin, and a first magnet facing the first coil;
wherein the second camera device comprises a second cover, a second bobbin disposed in the second cover, a second coil disposed on the second bobbin, and a second magnet facing the second coil;
wherein the first magnet comprises four magnets disposed at positions corresponding to four corners of the first cover, respectively;
wherein the second cover comprises second-first and second-second lateral plates opposite to each other, and second-third and second-fourth lateral plates opposite to each other;
wherein the second magnet comprises a second-first magnet disposed between the second coil and the second-third lateral plate, and a second-second magnet disposed between the second coil and the second-fourth lateral plate; and
wherein the second cover is larger than the first cover when viewed from above.

2. The camera device of claim 1, wherein the second-first magnet is parallel to the second-third lateral plate.

3. The camera device of claim 1, wherein the first cover comprises first-first and first-second lateral plates opposite to each other, and first-third and first-fourth lateral plates opposite to each other,
wherein the first-first lateral plate faces the second-first lateral plate.

4. The camera device of claim 3, wherein the first-first lateral plate is parallel to the second-first lateral plate.

5. The camera device of claim 3, wherein the four magnets of the first magnet comprise a first-first magnet disposed between the first-first lateral plate and the first-third lateral plate, a first-second magnet disposed between the first-first lateral plate and the first-fourth lateral plate, a first-third magnet disposed between the first-second lateral plate and the first-third lateral plate, and a first-fourth magnet disposed between the first-second lateral plate and the first-fourth lateral plate.

6. The camera device of claim 1, comprising a third camera device,
wherein the second camera device is disposed between the first camera device and the third camera device.

7. The camera device of claim 6, wherein the third camera device comprises a third cover, a third bobbin disposed in the third cover, a third coil disposed on the third bobbin, and a third magnet facing the third coil;
wherein the third cover comprises third-first and third-second lateral plates opposite to each other, and third-third and third-fourth lateral plates opposite to each other;
wherein the third-first lateral plate faces the second-second lateral plate, and
wherein the third magnet comprises a third-first magnet disposed between the third coil and the third-third lateral plate, and a third-second magnet disposed between the third coil and the third-fourth lateral plate.

8. The camera device of claim 7, wherein a distance between the third-first magnet and the third-first lateral plate is shorter than a distance between the third-first magnet and the third-second lateral plate.

9. The camera device of claim 8, wherein a distance between the third-second magnet and the third-second lateral plate is shorter than a distance between the third-second magnet and the third-first lateral plate.

10. The camera device of claim 7, wherein the first cover is larger than the third cover when viewed from above.

11. The camera device of claim 1, wherein the second camera device comprises a fourth magnet disposed on the second bobbin, and a Hall sensor for sensing the fourth magnet, and
wherein the Hall sensor is disposed between the fourth magnet and the second-second lateral plate.

12. The camera device of claim 11, wherein the second camera device comprises a fifth magnet disposed on the second bobbin, and
wherein the fifth magnet is symmetrical to the fourth magnet about an optical axis of the second camera device.

13. The camera device of claim 1, wherein the first camera device comprises a first base and a fourth coil disposed on the first base, and
   wherein the fourth coil is configured to move the first magnet in a direction perpendicular to an optical axis of the first camera device.

14. The camera device of claim 1, wherein the second coil is longer than the first coil when viewed from above.

15. An optical apparatus comprising:
   a main body;
   the camera device of claim 1 disposed on the main body; and
   a display disposed on the main body and configured to output an image photographed by the camera device.

16. A camera device comprising:
   a first camera device and a second camera device,
   wherein the first camera device comprises a first cover, a first bobbin disposed in the first cover, a first coil disposed on the first bobbin, and a first magnet facing the first coil;
   wherein the second camera device comprises a second cover, a second bobbin disposed in the second cover, a second coil disposed on the second bobbin, and a second magnet facing the second coil;
   wherein the first cover comprises first-first and first-second lateral plates opposite to each other, and first-third and first-fourth lateral plates opposite to each other;
   wherein the second cover comprises second-first and second-second lateral plates opposite to each other, and second-third and second-fourth lateral plates opposite to each other;
   wherein the first-first lateral plate faces the second-first lateral plate;
   wherein the first magnet comprises a first-first magnet disposed between the first-first lateral plate and the first-third lateral plate, a first-second magnet disposed between the first-first lateral plate and the first-fourth lateral plate, a first-third magnet disposed between the first-second lateral plate and the first-third lateral plate, and a first-fourth magnet disposed between the first-second lateral plate and the first-fourth lateral plate;
   wherein the second magnet comprises a second-first magnet disposed between the second coil and the second-third lateral plate, and a second-second magnet disposed between the second coil and the second-fourth lateral plate; and
   wherein the second cover is larger than the first cover when viewed from above.

17. The camera device of claim 16, wherein the second-first magnet is parallel to the second-third lateral plate.

18. The camera device of claim 16, wherein the first-first lateral plate is parallel to the second-first lateral plate.

19. The camera device of claim 16, comprising a third camera device,
   wherein the second camera device is disposed between the first camera device and the third camera device.

20. The camera device of claim 16, wherein the second coil is longer than the first coil when viewed from above.

* * * * *